(12) United States Patent
Kim et al.

(10) Patent No.: US 10,923,518 B2
(45) Date of Patent: Feb. 16, 2021

(54) IMAGE SENSOR AND METHOD OF FABRICATING THE SAME

(71) Applicant: Samsung Electronics Co., Ltd., Gyeonggi-do (KR)

(72) Inventors: Hong Ki Kim, Hwaseong-si (KR); Jung Chak Ahn, Yongin-si (KR); In Sung Joe, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 8 days.

(21) Appl. No.: 16/014,557

(22) Filed: Jun. 21, 2018

(65) Prior Publication Data

US 2019/0157329 A1    May 23, 2019

(30) Foreign Application Priority Data

Nov. 20, 2017   (KR) .................... 10-2017-0154737

(51) Int. Cl.
*H01L 27/146* (2006.01)

(52) U.S. Cl.
CPC .... *H01L 27/14621* (2013.01); *H01L 27/1463* (2013.01); *H01L 27/1464* (2013.01); *H01L 27/14603* (2013.01); *H01L 27/14612* (2013.01); *H01L 27/14638* (2013.01); *H01L 27/14683* (2013.01); *H01L 27/14685* (2013.01); *H01L 27/14627* (2013.01)

(58) Field of Classification Search
CPC ........... H01L 27/14621; H01L 27/1464; H01L 27/14685; H01L 27/14603; H01L 27/14612; H01L 27/14683; H01L 27/1463
See application file for complete search history.

(56) References Cited

U.S. PATENT DOCUMENTS

| | | | | |
|---|---|---|---|---|
| 8,378,440 B2 * | 2/2013 | Kwon | ............... | H01L 27/14621 |
| | | | | 257/432 |
| 8,502,130 B2 * | 8/2013 | Tay | .................. | H01L 27/14621 |
| | | | | 250/208.1 |
| 8,507,964 B2 * | 8/2013 | Nozaki | ............ | H01L 27/14621 |
| | | | | 257/294 |
| 9,224,770 B2 * | 12/2015 | Lin | ................... | H01L 27/14609 |
| 9,236,413 B2 * | 1/2016 | Kurihara | ........... | H01L 27/14605 |
| 9,263,485 B2 | 2/2016 | Furuta | | |
| 9,287,423 B2 * | 3/2016 | Mori | .................. | H01L 27/1462 |
| 9,305,965 B2 * | 4/2016 | Kurihara | .......... | H01L 27/14627 |
| 9,443,892 B2 * | 9/2016 | Koo | .................. | H01L 27/14612 |
| 10,014,338 B2 * | 7/2018 | Lee | .................... | H01L 27/14621 |
| 10,032,819 B2 * | 7/2018 | Lee | ..................... | H01L 29/0649 |

(Continued)

FOREIGN PATENT DOCUMENTS

| | | | |
|---|---|---|---|
| JP | 2009111225 A | 5/2009 | |
| JP | 2015-002340 A | 1/2015 | |

(Continued)

*Primary Examiner* — Earl N Taylor

(74) *Attorney, Agent, or Firm* — Harness, Dickey & Pierce, P.L.C.

(57) ABSTRACT

An image sensor and a method of fabricating the same are provided. The image sensor includes a substrate including photoelectric elements, a first color filter disposed on the substrate, a second color filter disposed on the substrate to be adjacent to the first color filter, a covering film disposed between sidewalls of the first and second color filters, and an air gap formed in the covering film.

19 Claims, 25 Drawing Sheets

(56) References Cited

U.S. PATENT DOCUMENTS

| | | | |
|---|---|---|---|
| 2005/0139945 A1* | 6/2005 | Lim | H01L 27/14627 257/432 |
| 2005/0141104 A1* | 6/2005 | Hong | H01L 27/14685 359/727 |
| 2006/0077268 A1* | 4/2006 | Yokozawa | H01L 27/14621 348/272 |
| 2006/0158547 A1* | 7/2006 | Komatsu | H01L 27/14623 348/340 |
| 2007/0040102 A1* | 2/2007 | Mouli | H01L 27/14625 250/214.1 |
| 2007/0045511 A1* | 3/2007 | Lee | H01L 27/14623 250/208.1 |
| 2008/0038863 A1* | 2/2008 | Rueger | H01L 31/02325 438/70 |
| 2009/0166518 A1* | 7/2009 | Tay | H01L 27/14629 250/227.11 |
| 2010/0060769 A1* | 3/2010 | Inuiya | H04N 9/04 348/311 |
| 2010/0078746 A1* | 4/2010 | Jung | H01L 27/14683 257/432 |
| 2010/0176474 A1* | 7/2010 | Kwon | H01L 27/1464 257/432 |
| 2011/0102651 A1* | 5/2011 | Tay | H01L 27/14687 348/280 |
| 2013/0285179 A1* | 10/2013 | Lin | H01L 27/14629 257/432 |
| 2013/0293751 A1* | 11/2013 | Vaartstra | H01L 31/18 348/280 |
| 2014/0117208 A1* | 5/2014 | Tay | H01L 27/14629 250/208.1 |
| 2014/0191349 A1* | 7/2014 | Kurihara | H01L 27/14685 257/432 |
| 2014/0199801 A1* | 7/2014 | Kurihara | H01L 27/14621 438/70 |
| 2014/0199802 A1* | 7/2014 | Kurihara | H01L 27/14685 438/70 |
| 2014/0199803 A1* | 7/2014 | Kurihara | H01L 27/14621 438/70 |
| 2014/0239362 A1* | 8/2014 | Koo | H01L 27/1464 257/294 |
| 2014/0367817 A1* | 12/2014 | Furuta | H01L 27/1464 257/432 |
| 2016/0013230 A1* | 1/2016 | Tay | H01L 27/14645 257/432 |
| 2016/0118431 A1* | 4/2016 | Dutartre | H01L 27/1462 257/432 |
| 2016/0133667 A1* | 5/2016 | Kurihara | H01L 27/14685 438/70 |
| 2017/0062498 A1* | 3/2017 | Suzuki | H01L 27/1463 |
| 2017/0133414 A1* | 5/2017 | Chiang | H01L 27/14627 |
| 2018/0151842 A1* | 5/2018 | Park | H01L 27/3211 |
| 2019/0097177 A1* | 3/2019 | Choi | H01L 31/02366 |
| 2019/0123083 A1* | 4/2019 | Borthakur | H01L 27/14685 |
| 2019/0148470 A1* | 5/2019 | Takagi | G09F 9/30 257/40 |
| 2019/0157329 A1* | 5/2019 | Kim | H01L 27/14621 |
| 2019/0162955 A1* | 5/2019 | Jang | G02B 5/201 |
| 2019/0267420 A1* | 8/2019 | Lee | H01L 27/14623 |

FOREIGN PATENT DOCUMENTS

| | | |
|---|---|---|
| JP | 2015-222814 A | 12/2015 |
| JP | 6103947 B2 | 3/2017 |

* cited by examiner

IMAGE SENSOR AND METHOD OF FABRICATING THE SAME

This application claims priority to Korean Patent Application No. 10-2017-0154737, filed on Nov. 20, 2017, and all the benefits accruing therefrom under 35 U.S.C. § 119, the disclosure of which is incorporated herein by reference in its entirety.

BACKGROUND

1. Technical Field

The present disclosure relates to an image sensor and a method of fabricating the same.

2. Description of the Related Art

An image sensor is a type of device that converts an optical image into an electrical signal. The image sensor can be classified into a charge-coupled device (CCD) type and a complementary metal oxide semiconductor (CMOS) type. A CMOS image sensor, abbreviated as a CIS, includes a plurality of pixels arranged two-dimensionally. Each of the pixels includes a photodiode (PD). The PD converts incident light into an electrical signal.

With recent developments in the computer industry and the communications industry, the demand for image sensors with improved performance has increased in various fields such as the fields of digital cameras, camcorders, personal communication systems (PCSs), game devices, surveillance cameras, medical micro cameras, and robots. In addition, as semiconductor devices are more highly integrated, image sensors are also more highly integrated.

SUMMARY

Some example embodiments of the present disclosure provide an image sensor with an improved picture quality.

Some example embodiments of the present disclosure also provide a method of fabricating an image sensor with improved picture quality.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

According to an example embodiment of the present disclosure, there is provided an image sensor comprising a substrate including photoelectric elements, a first color filter on the substrate, a second color filter on the substrate adjacent to the first color filter, a covering film between sidewalls of the first and second color filters, and an air gap in the covering film.

According to an example embodiment of the present disclosure, there is provided an image sensor comprising, a substrate including photoelectric elements, a color filter disposed on the substrate and having a first sidewall, a second sidewall, which crosses the first sidewall, a third sidewall, which is opposite to the first sidewall, and a fourth sidewall, which is opposite to the second sidewall, a covering film disposed on the first, second, third, and fourth sidewalls, and first, second, third, and fourth air gaps formed in the covering film and disposed along the first, second, third, and fourth sidewalls, respectively.

According to an example embodiment of the present disclosure, there is provided an image sensor comprising, a substrate including photoelectric elements, a first color filter disposed on the substrate and including a first sidewall, a second color filter disposed on the substrate and including a second sidewall, which is opposite to the first sidewall, a covering film disposed between the first and second sidewalls, and a void formed in the covering film.

Other features and example embodiments may be apparent from the following detailed description, the drawings, and the claims.

BRIEF DESCRIPTION OF THE DRAWINGS

The above and other example embodiments and features of the present disclosure will become more apparent by describing in detail example embodiments thereof with reference to the attached drawings, in which.

DETAILED DESCRIPTION

An image sensor according to some example embodiments of the present disclosure will hereinafter be described with reference to FIGS. 1 through 5E.

Figure 1:
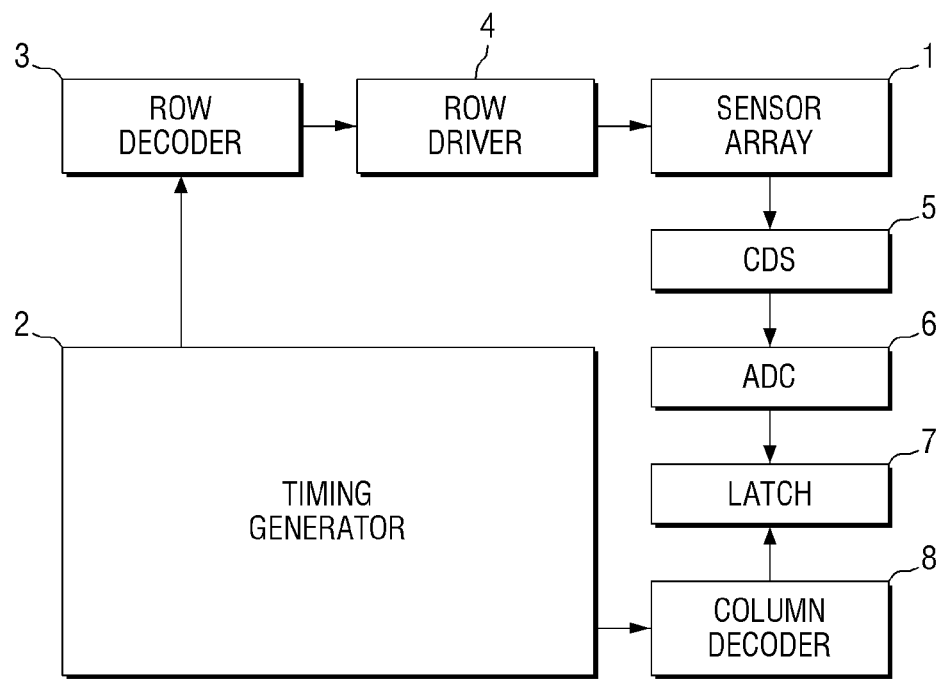
FIG. 1 is a block diagram of an image sensor according to some example embodiments of the present disclosure.
Figure 2:
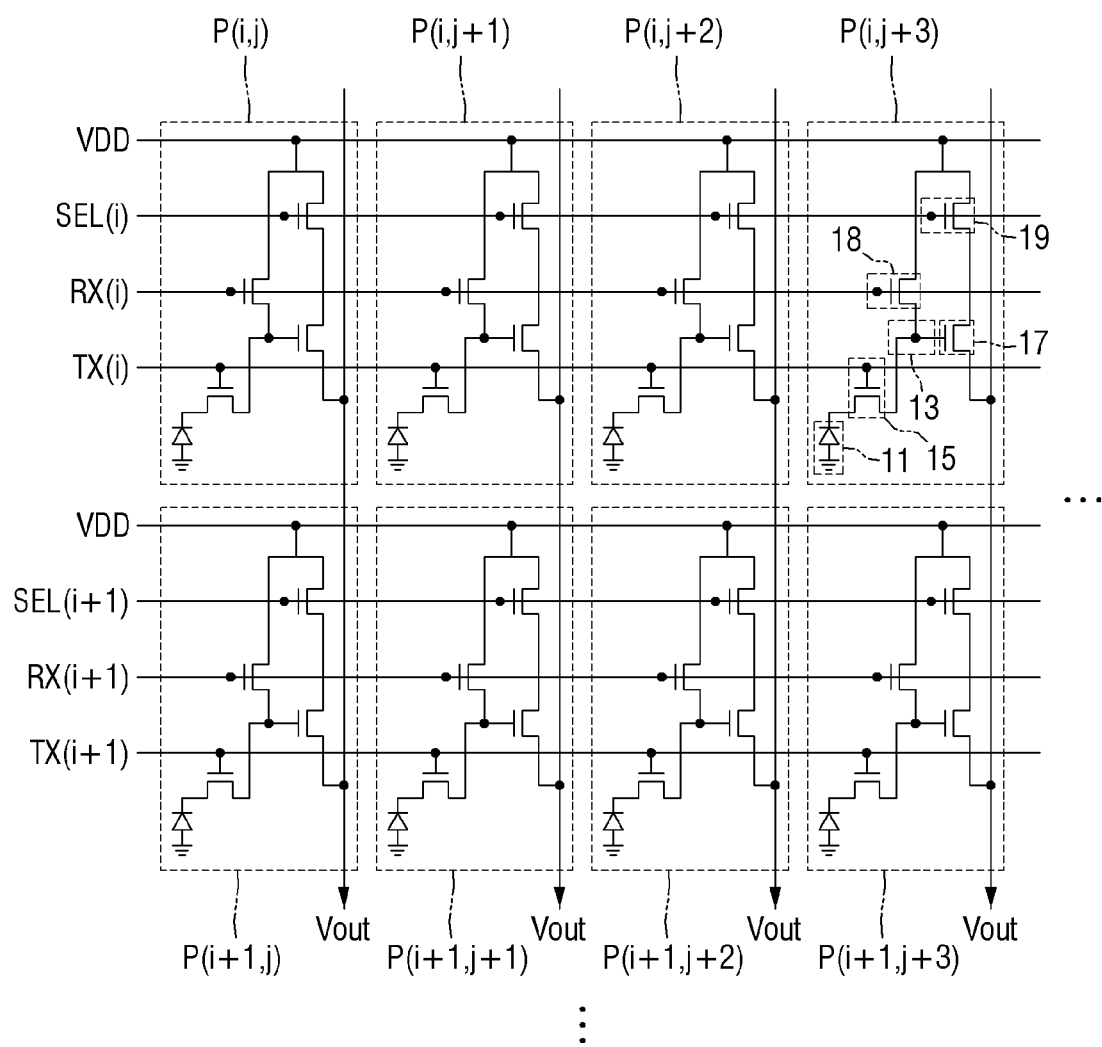
FIG. 2 is an equivalent circuit diagram of a sensor array illustrated in FIG. 1.
Figure 3:
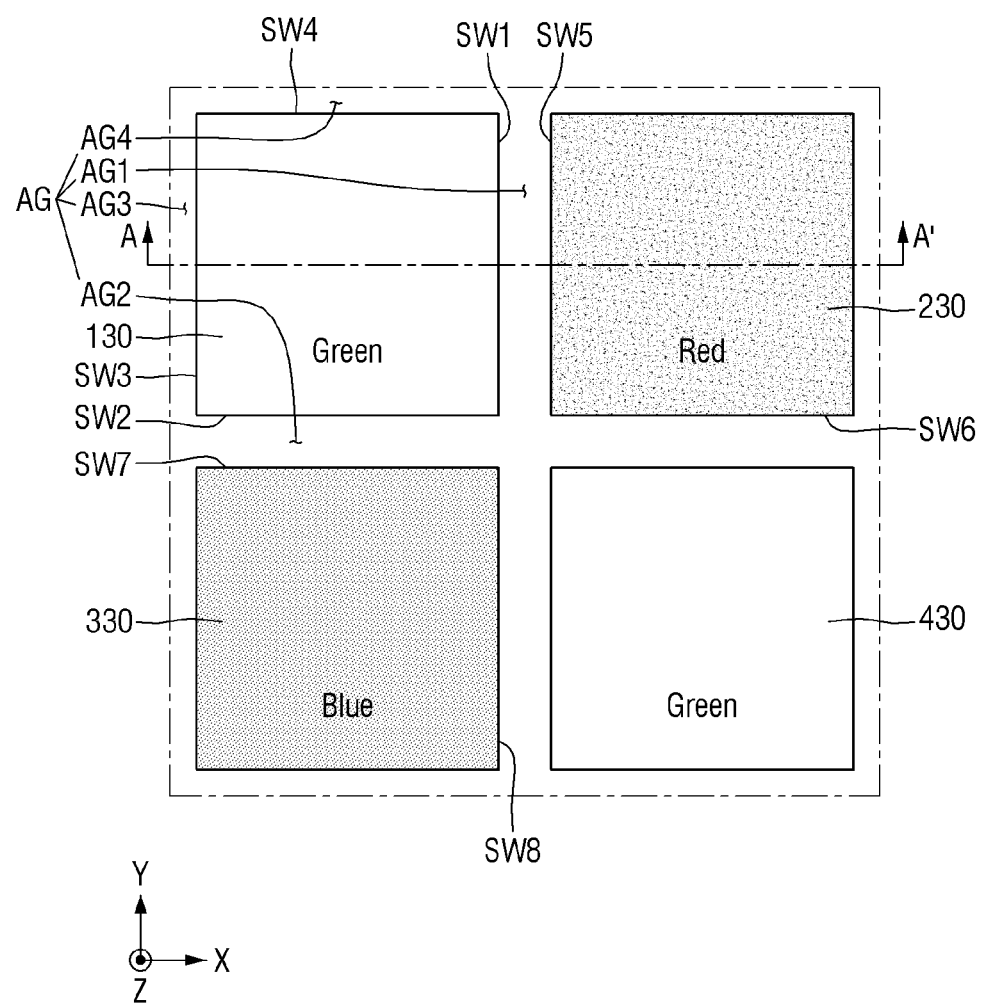
FIG. 3 is a layout view illustrating the image sensor according to some example embodiments of the present disclosure.
Figure 4:
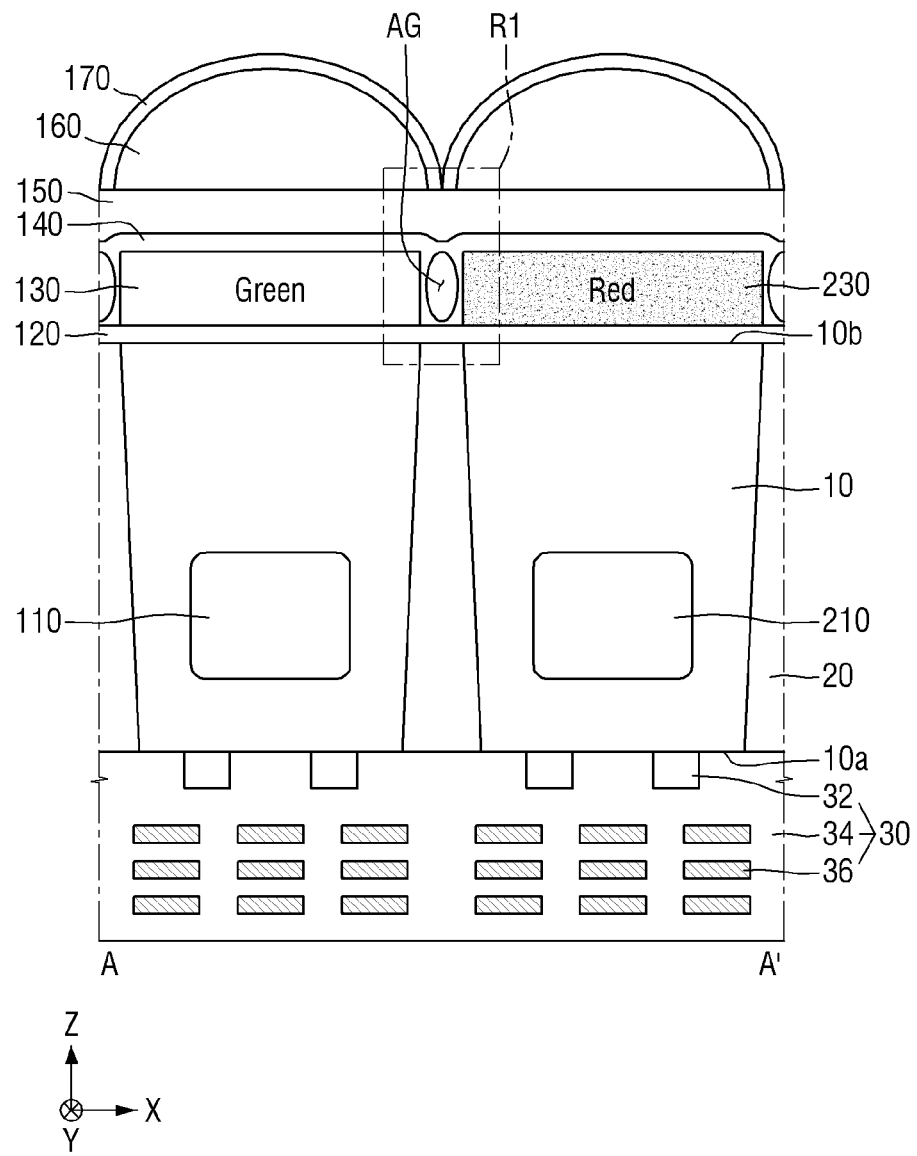
FIG. 4 is a schematic cross-sectional view taken along line A-A' of FIG. 3.

FIG. 1 is a block diagram of an image sensor according to some example embodiments of the present disclosure. FIG. 2 is an equivalent circuit diagram of a sensor array illustrated in FIG. 1. FIG. 3 is a layout view illustrating the image sensor according to some example embodiments of the present disclosure. FIG. 4 is a schematic cross-sectional view taken along line A-A' of FIG. 3.

Referring to FIG. 1, the image sensor according to some example embodiments of the present disclosure may include a sensor array 1, a timing generator 2, a row decoder 3, a row driver 4, a correlated double sampler (CDS) 5, an analog-to-digital converter (ADC) 6, a latch 7, and/or a column decoder 8.

The sensor array 1 may include a two-dimensional (2D) arrangement of a plurality of pixels each having a photoelectric element. That is, the sensor array 1 may include a plurality of unit pixels that are arranged two-dimensionally. Each of the unit pixels converts an optical image into an electrical output signal. The sensor array 1 is driven by receiving multiple driving signals such as a row selection signal, a reset signal, and a charge transfer signal from the row driver 4. An electrical output signal of the sensor array 1 is provided to the CDS 5.

The timing generator 2 provides timing signals and control signals to the row decoder 3 and the column decoder 8.

The row driver 4 provides a plurality of driving signals for driving the unit pixels to the sensor array 1 in accordance with the result of decoding performed by the row decoder 3. In a case where the unit pixels are arranged in a matrix of rows and columns, the row driver 4 provides a driving signal to each of the rows of the matrix.

The CDS 5 receives the output signal of the sensor array 1 via a vertical signal line and holds and samples the received signal. That is, the CDS 5 double-samples a particular noise level and a signal level corresponding to the output signal of the sensor array 1 and outputs the difference between the particular noise level and the signal level.

The ADC 6 converts an analog signal corresponding to the difference between the particular noise level and the signal level into a digital signal and outputs the digital signal.

The latch 7 latches the digital signal, and the latched signal is sequentially output to an image signal processing module in accordance with the result of decoding performed by the column decoder 8.

Referring to FIG. 2, unit pixels P are arranged in a matrix form and thus form the sensor array 1. Each of the pixels P may include a photoelectric transistor 11, a floating diffusion region 13, a charge transfer transistor 15, a drive transistor 17, a reset transistor 18, and/or a select transistor 19. The functions of the photoelectric transistor 11, the floating diffusion region 13, the charge transfer transistor 15, the drive transistor 17, the reset transistor 18, and the select transistor 19 will hereinafter be described, taking an i-th row of pixels P, e.g., pixels P(i, j), P(i, j+1), P(i, j+2), P(i, j+3), . . . .

The photoelectric transistor 11 absorbs incident light and accumulates charges corresponding to the amount of the absorbed light. A photodiode (PD), a photo-transistor, a photo-gate, a pinned PD (PPD), or a combination thereof may be used as the photoelectric transistor 11. The photoelectric transistor 11 is illustrated in FIG. 2 as being a PD.

The photoelectric transistor 11 is coupled to the charge transfer transistor 15, which transmits the charges accumulated in the photoelectric transistor 11 to the floating diffusion region 13. Since the floating diffusion region 13, which converts charges into a voltage, has parasitic capacitance, the floating diffusion region 13 can store charges therein accumulatively.

The drive transistor 17, which is an example follower amplifier, amplifies a variation in the electric potential of the floating diffusion region 13 that receives the charges accumulated in the photoelectric transistor 11, and outputs the result of the amplification to an output line Vout.

The reset transistor 18 periodically resets the floating diffusion region 13. The reset transistor 18 may include a MOS transistor driven by a reset line RX(i), which applies a predetermined (or alternatively, desired) bias (e.g., a reset signal). In response to the reset transistor 18 being turned on by the bias provided by the reset line RX(i), a predetermined (or alternatively, desired) electric potential provided to the drain of the reset transistor 18, for example, a power supply voltage VDD, is transmitted to the floating diffusion region 13.

The select transistor 19 selects a row of unit pixels P to be read. The select transistor 19 may include a single MOS transistor driven by a row selection line SEL(i), which applies a predetermined (or alternatively, desired) bias (e.g., a row selection signal). In response to the select transistor 19 being turned on by the bias provided by the row selection line SEL(i), a predetermined (or alternatively, desired) electric potential provided to the drain of the select transistor 19, for example, the power supply voltage VDD, is transmitted to the drain of the drive transistor 17.

A transmission line TX(i), which applies a bias to the charge transfer transistor 15, the reset line RX(i), which applies a bias to the reset transistor 18, and the row selection line SEL(i), which applies a bias to the select transistor 19, may extend substantially in parallel to one another along a row direction.

Referring to FIGS. 3 and 4, the image sensor according to some example embodiments of the present disclosure may include a substrate 10, an isolation film 20, an insulating structure 30, a lower planarization film 120, first, second, third, and fourth color filters 130, 230, 330, and 430, a covering film 140, air gaps AG, an upper planarization film 150, microlenses 160, and/or a protective film 170.

FIG. 4 illustrates the structure of the surroundings of the photoelectric transistor 11 of FIG. 2. The photoelectric transistor 11 of FIG. 2 may correspond to first and second photoelectric elements 110 and 210. FIG. 3 is a layout view for explaining the air gaps AG of FIG. 4. For convenience, the covering film 140 of FIG. 3 is not illustrated in FIG. 4.

The substrate 10 includes first and second surfaces 10a and 10b, which face each other. For example, the first surface 10a of the substrate 10 may be the front side of the substrate 10, and the second surface 10b of the substrate 10 may be the back side of the substrate 10. However, the present disclosure is not limited to this example.

The substrate 10 may be, for example, a P- or N-type bulk substrate, a P-type bulk substrate with a P- or N-type epitaxial layer grown thereon, or an N-type bulk with a P- or N-type epitaxial layer grown thereon. Examples of the substrate 10 may include not only a semiconductor substrate, but also a non-semiconductor substrate such as an organic plastic substrate.

The substrate 10 may include the first and second photoelectric elements 110 and 210. The first and second photoelectric elements 110 and 210 may correspond to the photoelectric transistor 11 of FIG. 2. For example, a PD, a photo-transistor, a photo-gate, a PPD, or a combination thereof may be used as the first or second photoelectric element 110 or 210.

The first and second photoelectric elements 110 and 210 may be photoelectric elements disposed adjacent to each other inside the substrate 10. For example, as illustrated in FIGS. 3 and 4, the first and second photoelectric elements 110 and 210 may be adjacent to each other in a first direction X.

The isolation film 20 may be formed in the substrate 10. The isolation film 20 may define a sensing area of the image sensor according to some example embodiments of the present disclosure in the substrate 10. The planar cross-sectional shape of the isolation film 20 may be a closed curve in the shape of a loop. Thus, a space enclosed by the isolation film 20 may be defined as the sensing area of the image sensor according to some example embodiments of the present disclosure.

As illustrated in FIG. 4, the isolation film 20 may have a tapered shape. For example, the width of the isolation film 20 may gradually decrease from the first surface 10a to the second surface 10b, but the present disclosure is not limited thereto. That is, the shape of the isolation film 20 may vary.

FIG. 4 illustrates an example in which the isolation film 20 extends from the first surface 10a to the second surface 10b, but the present disclosure is not limited to this example. That is, in another example, the isolation film 20 may extend from the first surface 10a along a third direction Z, but may not reach the second surface 10b. In yet another example, the isolation film 20 may extend from the second surface 10b, but may not reach the first surface 10a.

The isolation film 20 may comprise at least one of, for example, silicon oxide, silicon nitride, silicon oxynitride, and a low dielectric constant material having a lower permittivity than silicon oxide. The low dielectric constant material may be, for example, flowable oxide (FOX), tonen silazene (TOSZ), undoped silicate glass (USG), borosilicate glass (BSG), phosphosilicate Glass (PSG), borophosphosilicate glass (BPSG), plasma enhanced tetra ethyl ortho silicate (PETEOS), fluoride silicate glass (FSG), carbon doped silicon oxide (CDO), xerogel, aerogel, amorphous fluorinated carbon, organosilicate glass (OSG), parylene, bisbenzocyclobutene (BCB), SiLK, polyimide, a porous polymeric material, or a combination thereof, but the present disclosure is not limited thereto.

The lower planarization film 120 may be formed on the substrate 10. For example, the lower planarization film 120 may be formed on the second surface 10b of the substrate 10. That is, the insulating structure 30 may be formed on the back side of the substrate 10. The lower planarization film 120 is illustrated as being a single layer, but the present disclosure is not limited thereto.

The lower planarization film 120 may be used as a buffer film for reducing or preventing the substrate 10 from being damaged during patterning for forming pads (not illustrated) in a non-pixel region.

The lower planarization film 120 may comprise at least one of, for example, a silicon oxide film-based material, a silicon nitride film-based material, a resin, and a combination thereof. For example, a silicon oxide film having a thickness of about 3000 Å to 8000 Å may be used as the lower planarization film 120.

The first, second, third, and fourth color filters 130, 230, 330, and 430 may be formed on the lower planarization film 120. Accordingly, the first, second, third, and fourth color filters 130, 230, 330, and 430 may be formed on the second surface 10b of the substrate 10. FIG. 4 illustrates an example in which the first and second color filters 130 and 230 overlap with the first and second photoelectric elements 110 and 210, respectively, but the present disclosure is not limited to this example. That is, in another example, the first color filter 130 may be formed to overlap with both the first and second photoelectric elements 110 and 210, in which case, the first and second photoelectric elements 110 and 210 may share a single color filter together.

As illustrated in FIG. 3, the first, second, third, and fourth color filters 130, 230, 330, and 430 may be arranged two-dimensionally. For example, the second color filter 230 may be disposed adjacent to the first color filter 130 in the first direction X, the third color filter 330 may be disposed adjacent to the first color filter 130 in a second direction Y, and the fourth color filter 430 may be disposed adjacent to the second color filter 230 in the second direction Y and may be disposed adjacent to the third color filter 330 in the first direction X.

Each of the first, second, third, and fourth color filters 130, 230, 330, and 430 may include one of red, green, and blue filters. FIG. 3 illustrates an example in which the first and fourth color filters 130 and 430 are green filters, the second color filter 230 is a red filter, and the third color filter 330 is a blue filter, but the present disclosure is not limited to this example. That is, the arrangement of red, green, and blue color filters may vary depending on the type of the unit pixels P. In another example, each of the first, second, third, and fourth color filters 130, 230, 330, and 430 may include a yellow filter, a magenta filter, a cyan filter, or a white filter.

Spaces may be formed between the first, second, third, and fourth color filters 130, 230, 330, and 430 to form the covering film 140 and the air gaps AG, which will both be described later. For example, as illustrated in FIG. 4, the first and second color filters 130 and 230 may be spaced apart from each other so that a space can be formed therebetween.

However, in some example embodiments, as illustrated in FIG. 4, the first, second, third, and fourth color filters 130, 230, 330, and 430 may be placed in contact with one another. For example, lower portions of the first and second color filters 130 and 230 may be placed in contact with each other so that a space can be formed between the first and second color filters 130 and 230.

In some example embodiments, the top surfaces of the first, second, third, and fourth color filters 130, 230, 330, and 430 may have a rectangular shape. For example, as illustrated in FIG. 3, the first color filter 130 may have a first sidewall SW1, a second sidewall SW2, which crosses the first sidewall SW1, a third sidewall SW3, which is opposite to the first sidewall SW1, and a fourth sidewall SW4, which is opposite to the second sidewall SW2. For example, the first and third sidewalls SW1 and SW3 may extend along the second direction Y, and the second and fourth sidewalls SW2 and SW4 may extend along the first direction X.

Similarly, the second color filter 230 may have a fifth sidewall SW5, which is opposite to the first sidewall SW1, and a sixth sidewall SW6, which crosses the fifth sidewall SW5. For example, the fifth sidewall SW5 may extend along the second direction Y, and the sixth sidewall SW6 may extend along the first direction X.

Similarly, the third color filter 330 may have a seventh sidewall SW7, which is opposite to the second sidewall SW2, and an eighth sidewall SW8, which crosses the seventh sidewall SW7. For example, the seventh sidewall SW7 may extend along the first direction X, and the eighth sidewall SW8 may extend along the second direction Y.

The covering film 140 may be formed between the first, second, third, and fourth color filters 130, 230, 330, and 430. For example, as illustrated in FIG. 4, the covering film 140 may be formed between opposing sidewalls of the first and second color filters 130 and 230.

The covering film 140 may comprise a material with poor step coverage. Thus, an air gap AG may be formed in the covering film 140 between the opposing sidewalls of the first and second color filters 130 and 230. This will be described later with reference to FIG. 18.

In some example embodiments, the covering film 140 may comprise a low-temperature oxide (LTO), which is a type of silicon oxide film. Since the LTO is fabricated at a low temperature of about 100° C. to 120° C., damage to films below the LTO can be reduced or prevented. Also, since the LTO is amorphous and thus has a smooth surface, the reflection, refraction, and/or diffusion of incident light can be reduced or minimized. For example, the covering film 140 may comprise phenyltriethoxysilane (PTEOS).

In some example embodiments, the covering film 140 may comprise a material having a lower refractive index. For example, the covering film 140 may comprise a material having a lower refractive index than the first, second, third, and fourth color filters 130, 230, 330, and 430.

The air gaps AG may be formed in the covering film 140 between the first, second, third, and fourth color filters 130, 230, 330, and 430. For example, as illustrated in FIG. 4, one air gap AG may be formed in the covering film 140 between the opposing sidewalls of the first and second color filters 130 and 230. That is, the air gaps AG may be defined by the covering film 140. The air gaps AG may be voids formed in the covering film 140.

FIG. 4 illustrates an example in which one air gap AG is formed in the covering film 140 between the opposing sidewalls of the first and second color filters 130 and 230, but the present disclosure is not limited to this example. That is, in another example, two or more air gaps AG may be formed in the covering film 140 between the opposing sidewalls of the first and second color filters 130 and 230 to be separated from each other by the covering film 140.

In some example embodiments, the air gaps AG may surround the first, second, third, and fourth color filters 130, 230, 330, and 430. For example, the covering film 140 may be formed on the first, second, third, and fourth sidewalls SW1, SW2, SW3, and SW4 of the first color filter 130. Since the air gaps AG are formed in the covering film 140, the air gaps AG may include first, second, third, and fourth air gaps AG1, AG2, AG3, and AG4, which surround the first color filter 130. The first air gap AG1 may be formed on the first sidewall SW1 of the first color filter 130, the second air gap AG2 may be formed on the second sidewall SW2 of the first color filter 130, the third air gap AG3 may be formed on the third sidewall SW3 of the first color filter 130, and the fourth air gap AG4 may be formed on the fourth sidewall SW4 of the first color filter 130.

In some example embodiments, the first, second, third, and fourth air gaps AG1, AG2, AG3, and AG4 may be connected to one another and therefore the same air gap. Accordingly, the air gaps AG may surround all or some of the first, second, third, and fourth sidewalls SW1, SW2, SW3, and SW4 of the first color filter 130.

The air gaps AG may reduce or prevent light incident upon the first, second, third, and fourth color filters 130, 230, 330, and 430 from being reflected or diffused laterally. For example, the air gaps AG may reduce or prevent light incident upon the first color filter 130 and then reflected or diffused at the interface between the first color filter 130 and the lower planarization film 120 from infiltrating into other unit pixels P. That is, the air gaps AG may reduce or minimize crosstalk between the unit pixels P. Since the refractive index of the air gaps AG is lower than the refractive index of the first, second, third, and fourth color filters 130, 230, 330, and 430 and the refractive index of the covering film 140, the air gaps AG may reduce or minimize crosstalk between the unit pixels P by inducing total reflection. Accordingly, the image sensor according to some example embodiments of the present disclosure can provide an improved picture quality. Although in example embodiments, total reflection is induced by a covering film 140 with or without air gaps AG, total reflection may be induced by other materials with a lower refractive index than the first, second, third, and fourth color filters 130, 230, 330, and 430. Still further, although in example embodiments, total reflection is induced by materials and/or air gaps with a lower refractive index than the first, second, third, and fourth color filters 130, 230, 330, and 430, total reflection may be induced by other techniques.

The upper planarization film 150 may be formed on the covering film 140. The upper planarization film 150 may comprise at least one of, for example, a silicon oxide film-based material, a silicon nitride film-based material, a resin, and a combination thereof. The upper planarization film 150 is illustrated as being a single layer, but the present disclosure is not limited thereto.

FIG. 4 illustrates an example in which the upper planarization film 150 and the lower planarization film 120 are formed above and below, respectively, of the first or second color filter 130 or 230, but the present disclosure is not limited to this example. In another example, a planarization film may be provided only below the first and second color filters 130 and 230 or only above the first and second color filters 130 and 230. In yet another example, there may be no planarization films above and below the first and second color filters 130 and 230.

The microlenses 160 may be formed on the upper planarization film 150. The microlenses 160 may have a convex shape and may have a predetermined (or alternatively, desired) radius of curvature. Accordingly, the microlenses 160 may condense incident light into the first and second photoelectric elements 110 and 210.

The microlenses 160 may comprise, for example, an organic material such as a light-transmitting resin, but the present disclosure is not limited thereto. That is, alternatively, the microlenses 160 may comprise an inorganic material.

The protective film 170 may be formed along the surfaces of the microlenses 160. The protective film 170 may comprise, for example, an inorganic oxide film. For example, the protective film 170 may comprise a silicon oxide (SiO2) film, a titanium oxide (TiO2) film, a zirconium oxide (ZrO2) film, a hafnium oxide (HfO2) film, or a stack or combination thereof.

In a case where the microlenses 160 comprise an organic material, the microlenses 160 may be vulnerable to an external impact. The protective film 170 may protect the microlenses 160 against an external impact.

Spaces may be formed between the microlenses 160. The protective film 170 may fill the spaces between the microlenses 160. In a case where the protective film 170 fills the spaces between the microlenses 160, the condensation of incident light can be improved because the reflection, refraction, or diffusion of incident light that arrives at the spaces between the microlenses 160 may be reduced.

The insulating structure 30 may be formed below the substrate 10. For example, the insulating structure 30 may be formed on the first surface 10a of the substrate 10. That is, the insulating structure 30 may be formed on the front side of the substrate 10, but the present disclosure is not limited thereto. That is, in another example, the insulating structure 30 may be formed on the second surface 10b of the substrate 10.

The insulating structure 30 may include gate structures 32, an insulating layer 34, and/or wiring structures 36.

The gate structures 32 may be formed on the first surface 10a of the substrate 10. The gate structures 32 may correspond to, for example, the gates of the charge transfer transistor 15, the drive transistor 17, the reset transistor 18, and/or the select transistor 19 of FIG. 2.

FIG. 4 illustrates an example in which the gate structures 32 are formed on the substrate 10, but the present disclosure is not limited to this example. That is, in another example, the gate structures 32 may be recessed into the substrate 10 or may be buried in the substrate 10.

The insulating layer 34 may comprise at least one of, for example, a silicon oxide film, a silicon nitride film, a silicon oxynitride film, a low dielectric constant material, and a combination thereof. The insulating layer 34 may cover and surround the gate structures 32 and the wiring structures 36. That is, the insulating layer 34 may electrically insulate the gate structures 32 from one another and may electrically insulate the wiring structures 36 from one another.

The wiring structures 36 may comprise a conductive material. For example, the wiring structures 36 may comprise Al, Cu, tungsten (W), cobalt (Co), or ruthenium (Ru).

The wiring structures 36 may include stacks of multiple wirings. FIG. 4 illustrates an example in which the wiring structures 36 include stacks of three layers, but the present disclosure is not limited to this example.

Since the wiring structures 36 are disposed on the first surface 10*a* of the substrate 10, the amount of incident light transmitted through the second surface 10*b* may further increase. Also, since the wiring structures 36 are disposed on the first surface 10*a* of the substrate 10, the condensation efficiency of the image sensor according to some example embodiments of the present disclosure may be increased maximized because incident light may be reflected by the wiring structures 36 and may thus travel toward the first or second photoelectric element 110 or 210.

FIGS. 5A through 5E are example enlarged views of a region R1 of FIG. 4.

Figure 5A:
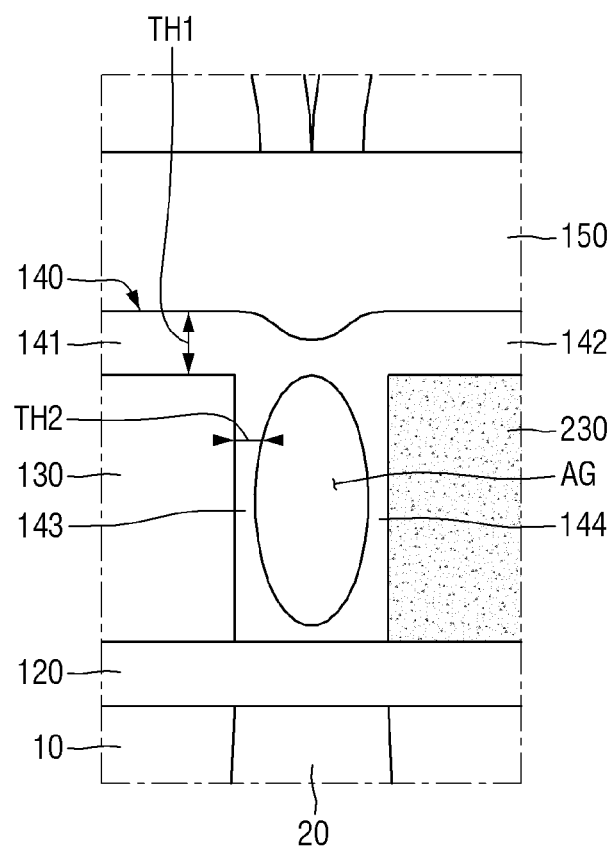
FIGS. 5A through 5E are example enlarged views of a region R1 of FIG. 4.

Referring to FIG. 5A, the covering film 140 may include a first portion 143, which extends along the sidewall of the first color filter 130, and a second portion 144, which extends along the sidewall of the second color filter 230. An upper part of the first portion 143 may be connected to an upper part of the second portion 144, and a lower part of the first portion 143 may be connected to a lower part of the second portion 144. Accordingly, an air gap AG, which is defined by the first and second portions 144, may be formed in the covering film 140. The air gap AG may be a void formed in the covering film 140.

In some example embodiments, a thickness TH1 of the first portion 143 may gradually decrease and then gradually increase away from the substrate 10. Similarly, the thickness of the second portion 144 may gradually decrease and then gradually increase away from the substrate 10. As a result, the width of the air gap AG may gradually increase and then gradually decrease away from the substrate 10. The air gap AG may have an elliptical cross-sectional shape, but the present disclosure is not limited thereto. The cross-sectional shape of the air gap AG may vary depending on the characteristics of, for example, a deposition process for forming the covering film 140. For example, the thickness TH1 of the first portion 143 and the thickness of the second portion 144 may vary in almost the same manner away from the substrate 10.

In some example embodiments, the covering film 140 may cover the top surfaces of the first, second, third, and fourth color filters 130, 230, 330, and 430. For example, the covering film 140 may include a third portion 141, which extends along the top surface of the first color filter 130, and a fourth portion 142, which extends along the top surface of the second color filter 230.

In some example embodiments, the thickness TH1 of the first portion 143 may be less than a thickness TH2 of the third portion 141. For example, the thickness TH2 of the third portion 141 may be about 200 nm to 400 nm, and the thickness TH1 of the first portion 143 may be less than the thickness TH2 of the third portion 141.

Figure 5B:
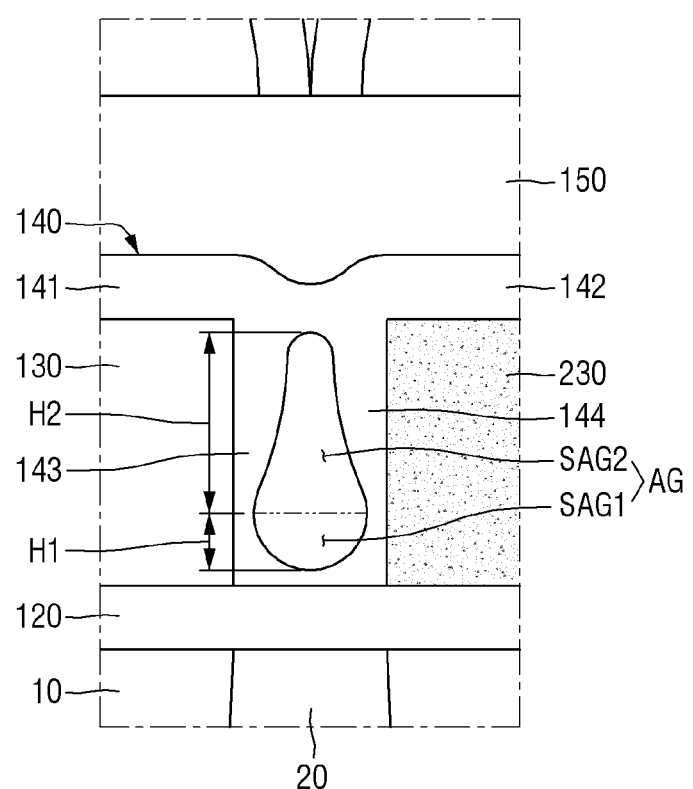

Referring to FIG. 5B, an air gap AG may include first and second sub-air gaps SAG1 and SAG2. The first and second sub-air gaps SAG1 and SAG2 may be adjacent, as shown in FIG. 5B, or separate as discussed below.

The first sub-air gap SAG1 may be a portion of the air gap AG whose width gradually increases away from the substrate 10, and the second sub-air gap SAG2 may be a portion of the air gap AG whose width gradually decreases away from the substrate 10. The second sub-air gap SAG2 may be on the first sub-air gap SAG1.

In some example embodiments, a first height H1 of the first sub-air gap SAG1 may be less than a second height H2 of the second sub-air gap SAG2. The first height H1 may be defined as the distance from the lowermost part to the uppermost part of the first sub-air gap SAG1. For example, the first and second sub-air gaps SAG1 and SAG2 may form an air gap AG having a water drop-like cross-sectional shape.

Figure 5C:
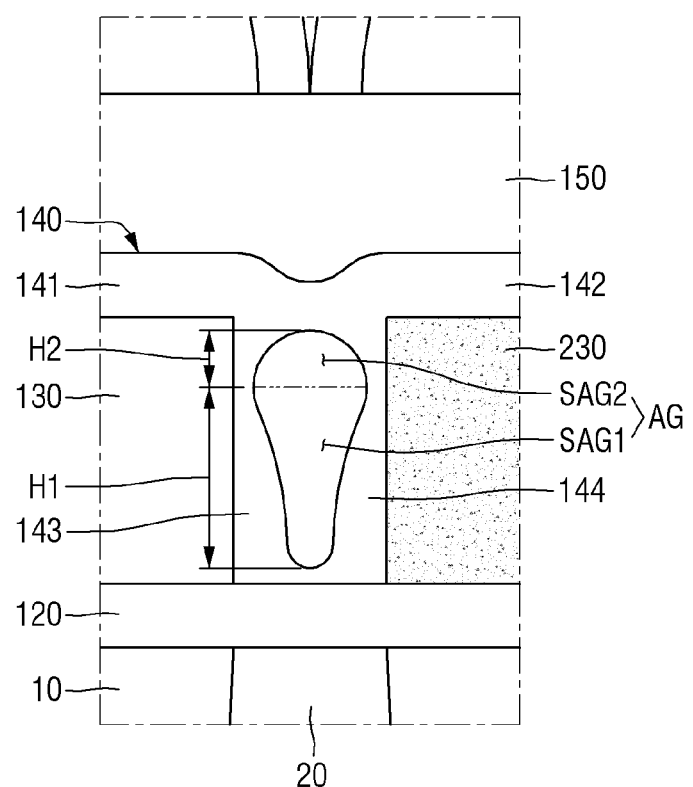

Referring to FIG. 5C, an air gap AG is substantially the same as its counterpart of FIG. 5B except that a first height H1 of a first sub-air gap SAG1 is greater than a second height H2 of a second sub-air gap SAG2. For example, referring to FIG. 5C, the first and second sub-air gaps SAG1 and SAG2 may form an air gap AG having an inverted water drop-like cross-sectional shape.

Figure 5D:
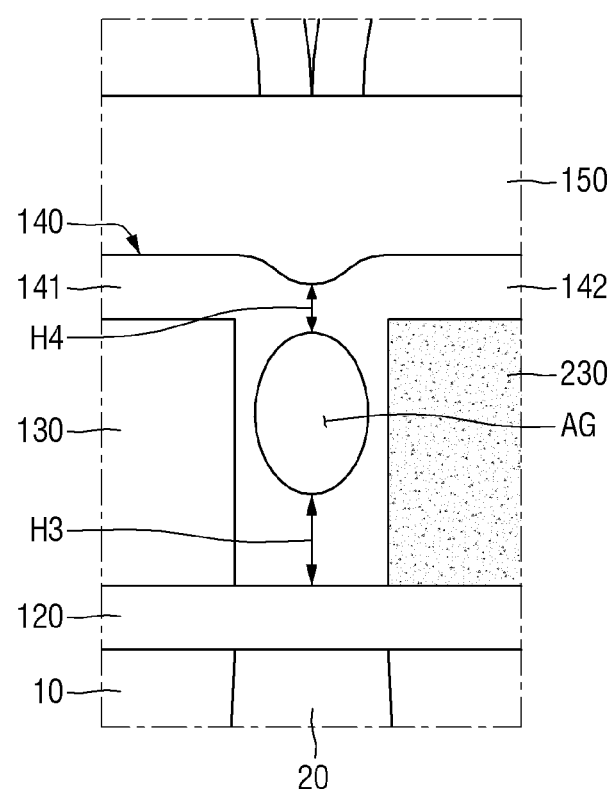

Referring to FIG. 5D, an air gap AG may be formed adjacent to the top surface of the covering film 140. For example, a third height H3 from the bottom surface of the covering film 140 to the lowermost part of the air gap AG may be greater than a fourth height H4 from the uppermost part of the air gap AG to the top surface of the covering film 140.

The air gap AG may have an elliptical cross-sectional shape, but the present disclosure is not limited thereto. For example, the cross-sectional shape of the air gap AG may vary depending on the characteristics of, for example, a deposition process for forming the covering film 140.

FIGS. 5A through 5D illustrate an example in which only one air gap AG is formed in the covering film 140 between opposing sidewalls of the first and second color filters 130 and 230, but the present disclosure is not limited to this example. In another example, two or more air gaps AG may be formed in the covering film 140 between the opposing sidewalls of the first and second color filters 130 and 230 to be separated from each other by the covering film 140.

Figure 5E:
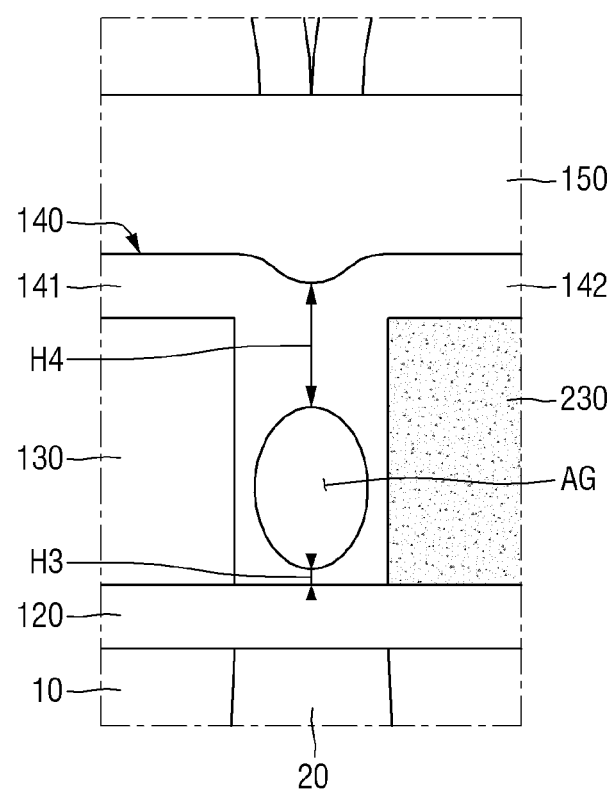

Referring to FIG. 5E, an air gap AG is substantially the same as its counterpart of FIG. 5E except that it is formed adjacent to the bottom surface of the covering film 140. For example, a third height H3 from the bottom surface of the covering film 140 to the lowermost part of the air gap AG may be less than a fourth height H4 from the uppermost part of the air gap AG to the top surface of the covering film 140.

Figure 6:
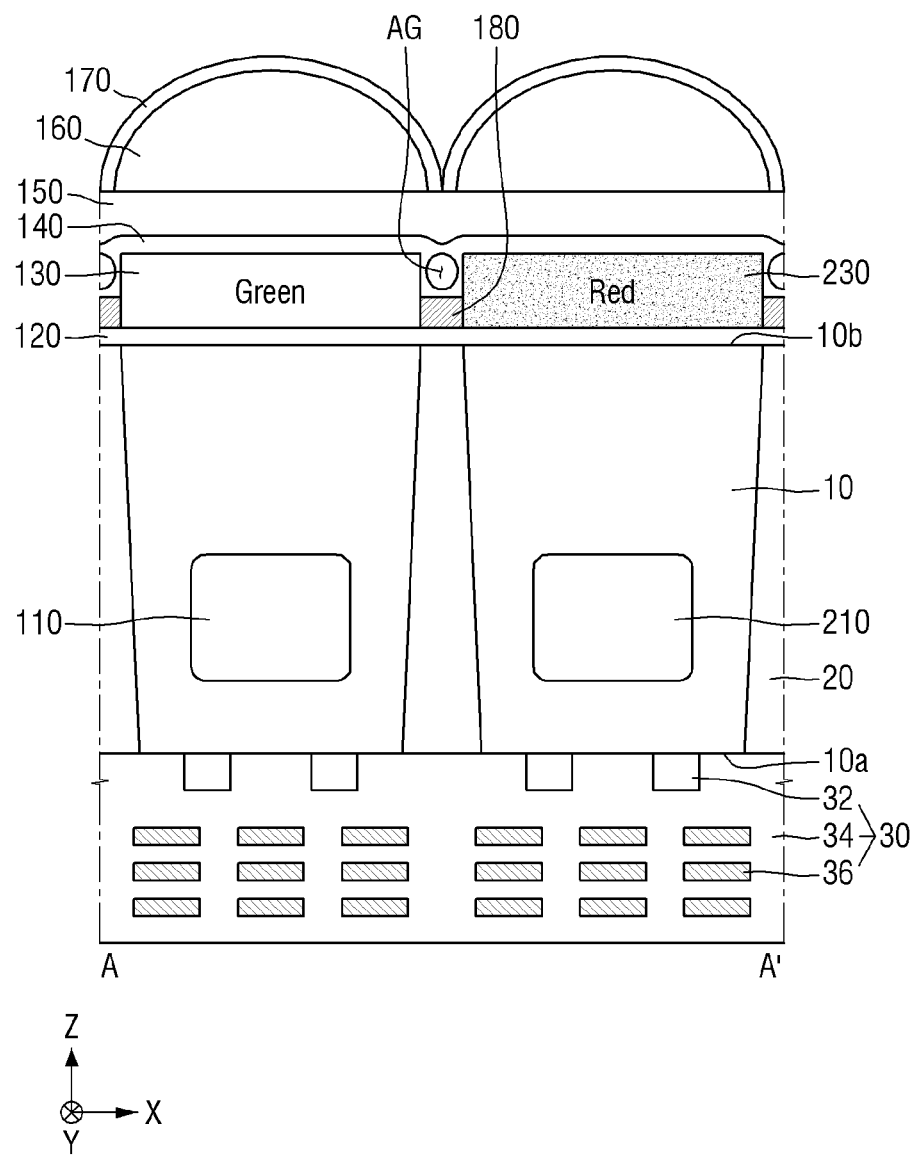
FIG. 6 is a cross-sectional view of an image sensor according to some example embodiments of the present disclosure.

FIG. 6 is a cross-sectional view of an image sensor according to some example embodiments of the present disclosure. For convenience, any redundant description of the example embodiments of FIGS. 1 through 5E will be omitted.

Referring to FIG. 6, the image sensor according to some example embodiments of the present disclosure further includes a grid pattern 180.

The grid pattern 180 may be formed on a lower planarization film 120. The grid pattern 180 may partially cover the lower planarization film 120. The grid pattern 180 may overlap with an isolation film 20 in a third direction Z.

The grid pattern 180 may be formed between first, second, third, and fourth color filters 130, 230, 330, and 430. For example, the grid pattern 180 may be formed between first and second color filters 130 and 230. The height of the top surface of the grid pattern 180 may be less than the height of the top surface(s) of the first color filter 130 and/or the second color filter 230. Since a covering film 140 is formed along the sidewalls of the first color filter 130 and along the sidewalls of the second color filter 230, the grid pattern 180 may be disposed below the covering film 140.

FIG. 6 illustrates an example in which the first and second color filters 130 and 230 cover the sidewalls of the grid pattern 180, but the present disclosure is not limited to this example. That is, in another example, the first color filter 130 and/or the second color filter 230 may cover not only the sidewalls of the grid pattern 180, but also part of the top surface of the grid pattern 180.

The grid pattern 180 may reduce or prevent light incident upon the first, second, third, and fourth color filters 130, 230, 330, and 430 from being reflected or diffused laterally. For example, the grid pattern 180 may reduce or prevent light incident upon the first, second, third, and fourth color filters 130, 230, 330, and 430 and then reflected or diffused at the interface between the lower planarization film 120 and the first, second, third, and fourth color filters 130, 230, 330, and 430 from infiltrating into other unit pixels P.

The grid pattern 180, like air gaps AG, may reduce or prevent light incident upon the first, second, third, and fourth color filters 130, 230, 330, and 430 from being reflected or diffused laterally. For example, the grid pattern 180 may reduce or prevent light incident upon the first color filter 130 and then reflected or diffused at the interface between the first color filter 130 and the lower planarization film 120 from infiltrating into other unit pixels P. That is, the grid pattern 180 may reduce or prevent crosstalk between the unit pixels P.

The grid pattern 180 may comprise a metal. For example, the grid pattern 180 may comprise at least one of W, Al, Cu, and a combination thereof.

Figure 7:
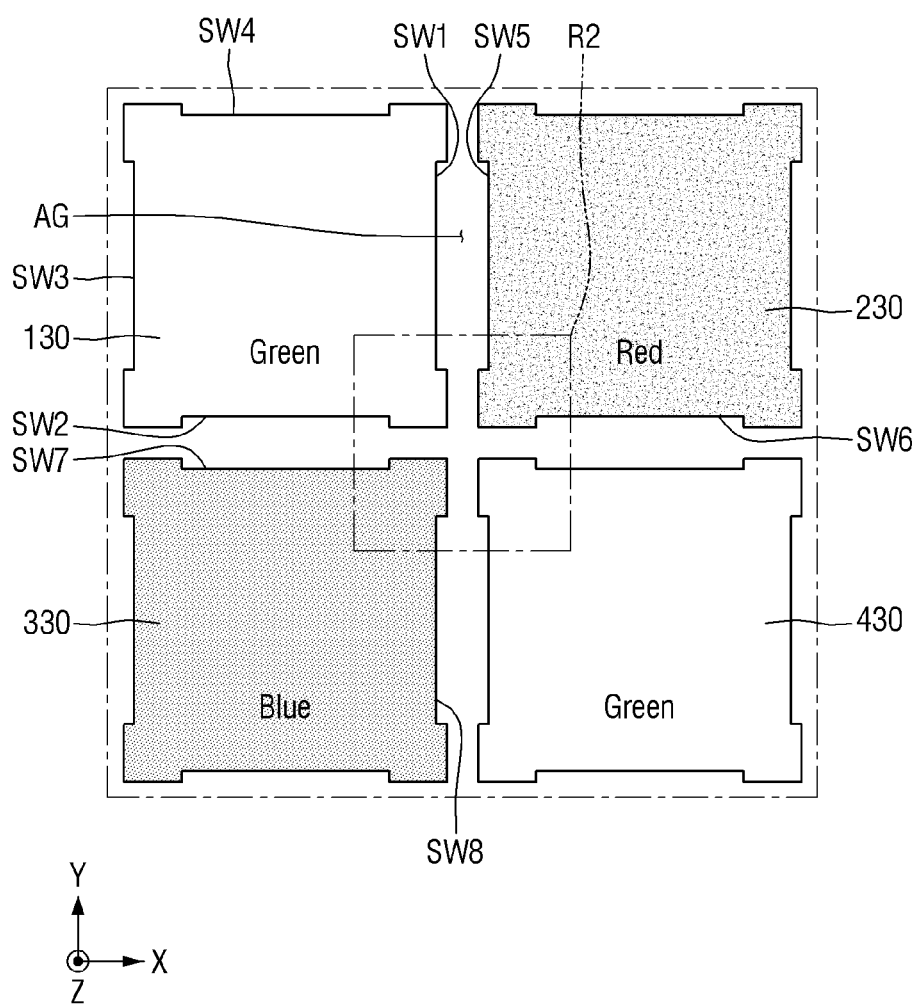
FIG. 7 is a layout view of an image sensor according to some example embodiments of the present disclosure.
Figure 8:
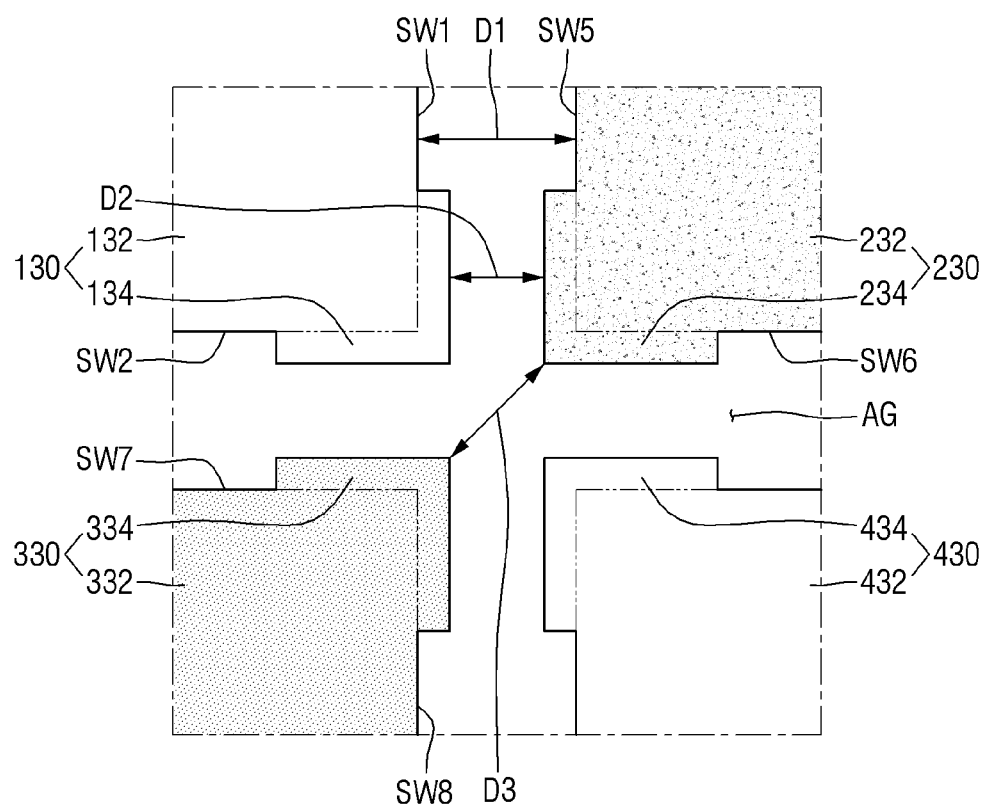
FIG. 8 is an enlarged view of a region R2 of FIG. 7.

FIG. 7 is a layout view of an image sensor according to some example embodiments of the present disclosure. FIG. 8 is an enlarged view of a region R2 of FIG. 7. For convenience, any redundant description of the example embodiments of FIGS. 1 through 5E will be omitted.

Referring to FIGS. 7 and 8, each of first, second, third, and fourth color filters 130, 230, 330, and 430 includes protruding portions. For example, the first color filter 130 may include a first central portion 132 and first protruding portions 134.

The first central portion 132 of the first color filter 130 may be a portion of the first color filter 130 whose top surface is rectangular in shape. For example, the first central portion 132 of the first color filter 130 may have the same shape as the first color filter 130 of FIG. 2. The first central portion 132 of the first color filter 130 may have first, second, third, and fourth sidewalls SW1, SW2, SW3, and SW4. That is, the first central portion 132 may be a portion of the first color filter 130 defined by the first, second, third, and fourth sidewalls SW1, SW2, SW3, and SW4.

The first protruding portions 134 of the first color filter 130 may be portions of the first color filter 130 projected from the sides of the first central portion 132. The first protruding portions 134 of the first color filter 130 may be disposed at the corners of the first central portion 132. For example, as illustrated in FIG. 8, one of the first protruding portions 134 of the first color filter 130 may protrude from parts of the first and second sidewalls SW1 and SW2 and may be disposed at a corner of the first central portion 132. That is, one of the first protruding portions 134 of the first color filter 130 may protrude from a corner of the first central portion 132 that is defined by the first and second sidewalls SW1 and SW2.

FIG. 7 illustrates an example in which the first protruding portions 134 of the first color filter 130 are formed at all the corners of the first central portion 132, but the present disclosure is not limited to this example. That is, in another example, the first protruding portions 134 of the first color filter 130 may be formed at only some of the corners of the first central portion 132.

Similarly, the second color filter 230 may include a second central portion 232 and second protruding portions 234. For example, the second color filter 230 may include a second central portion 232 having fifth and sixth sidewalls SW5 and SW6. The second protruding portions 234 of the second color filter 230 may protrude from parts of the fifth and sixth sidewalls SW5 and SW6 and may be disposed at a corner of the second central portion 232.

Similarly, the third color filter 330 may include a third central portion 332 and third protruding portions 334. For example, the third color filter 330 may include a third central portion 332 having seventh and eighth sidewalls SW7 and SW8. The third protruding portions 334 of the third color filter 330 may protrude from parts of the seventh and eighth sidewalls SW7 and SW8 and may be disposed at a corner of the third central portion 332.

Similarly, the fourth color filter 430 may include a fourth central portion 432 and fourth protruding portions 434.

In some example embodiments, the top surfaces of the first protruding portions 134, the second protruding portions 234, the third protruding portions 334, and/or the fourth protruding portions 434 may be L-shaped.

The distance between the first protruding portions 134, the second protruding portions 234, the third protruding portions 334, and the fourth protruding portions 434 may be smaller than the distance between the first, second, third, and fourth central portions 132, 232, 332, and 432. For example, since the first protruding portions 134 protrude from parts of the sidewalls of the first central portion 132 and the second protruding portions 234 protrude from parts of the sidewalls of the second central portion 232, a second distance between the first protruding portions 134 and the second protruding portions 234 may be smaller than a first distance D1 between the first central portion 132 and the second central portion 232.

In some example embodiments, a third distance D3 between the second protruding portions 234 and the third protruding portions 334 may be smaller than the first distance D1 between the first central portion 132 and the second central portion 232.

In a case where there are large gaps between color filters, air gaps AG may not be able to be properly formed in a covering film 140. For example, since the gaps between the color filters are wide, especially around the corners of each of the color filters, the air gaps AG may not be properly formed in the covering film 140. However, since the image sensor according to some example embodiments of the present disclosure includes the first protruding portions 134, the second protruding portions 234, the third protruding portions 334, and the fourth protruding portions 434, the air gaps AG can be formed even in areas near the corners of each of the color filters.

Figure 9:
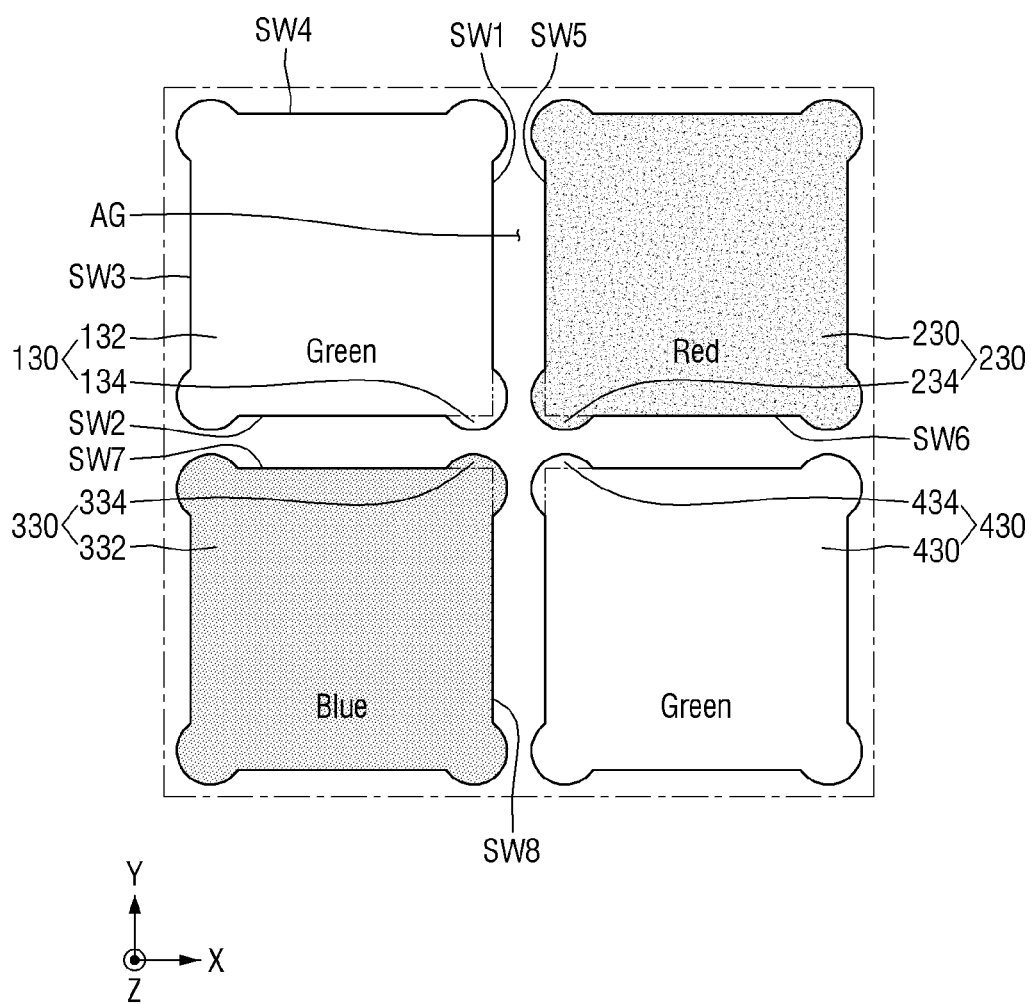
FIG. 9 is a layout view of an image sensor according to some example embodiments of the present disclosure.

FIG. 9 is a layout view of an image sensor according to some example embodiments of the present disclosure. For convenience, any redundant description of the example embodiments of FIGS. 1 through 5E and 8 will be omitted.

Referring to FIG. 9, the top surfaces of first protruding portions 134, second protruding portions 234, third protruding portions 334, and/or fourth protruding portions 434 may be curved or circular in shape.

That is, the top surfaces of the first protruding portions 134, the second protruding portions 234, the third protruding portions 334, and/or the fourth protruding portions 434 of FIG. 8 may be L-shaped, but the top surfaces of the first protruding portions 134, the second protruding portions 234, the third protruding portions 334, and the fourth protruding portions 434 of FIG. 9 may be curved or circular in shape. However, the present disclosure is not limited to the examples of FIGS. 8 and 9. The shape of the first protruding portions 134, which are disposed at the corners of a first central portion 132, the second protruding portions 234, which are disposed at the corners of a second central portion 232, the third protruding portions 334, which are disposed at the corners of a third central portion 332, and the fourth protruding portions 434, which are disposed at the corners of a fourth central portion 432, may vary.

Figure 10:
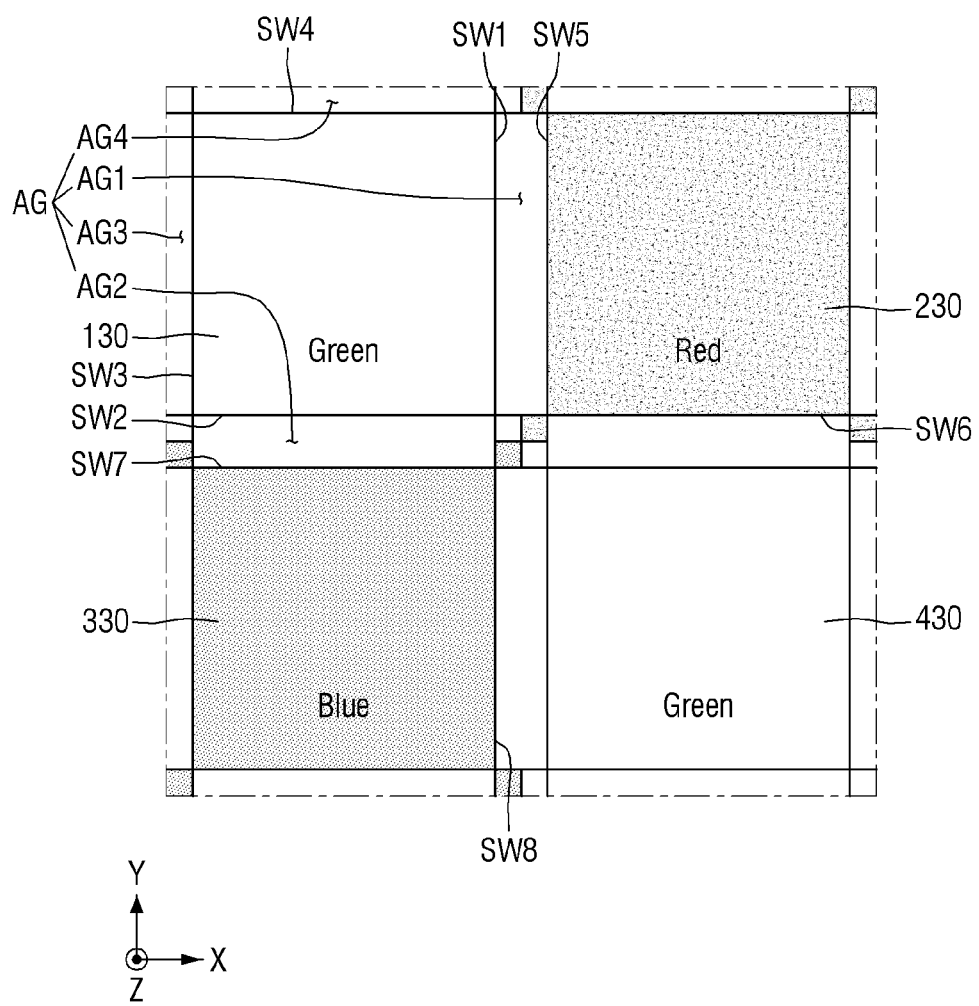
FIG. 10 is a layout view of an image sensor according to some example embodiments of the present disclosure.

FIG. 10 is a layout view of an image sensor according to some example embodiments of the present disclosure. For convenience, any redundant description of the example embodiments of FIGS. 1 through 5E will be omitted.

Referring to FIG. 10, at least two of first, second, third, and fourth air gaps AG1, AG2, AG3, and AG4 may be spaced apart from each other.

For example, part of a covering film 140 on a first sidewall SW1 and part of the covering film 140 on a second sidewall SW2 may be placed in point contact with each other. Since air gaps AG are formed in the covering film 140, the first air gap AG1, which is disposed on the first sidewall SW1, and the second air gap AG2, which is on the second sidewall SW2, may be spaced apart from each other.

As illustrated in FIG. 10, the first, second, third, and fourth air gaps AG1, AG2, AG3, and AG4 may be completely or partially spaced apart from one another. However, in some example embodiments, at least two of the first, second, third, and fourth air gaps AG1, AG2, AG3, and AG4 may be connected to each other.

Figure 11:
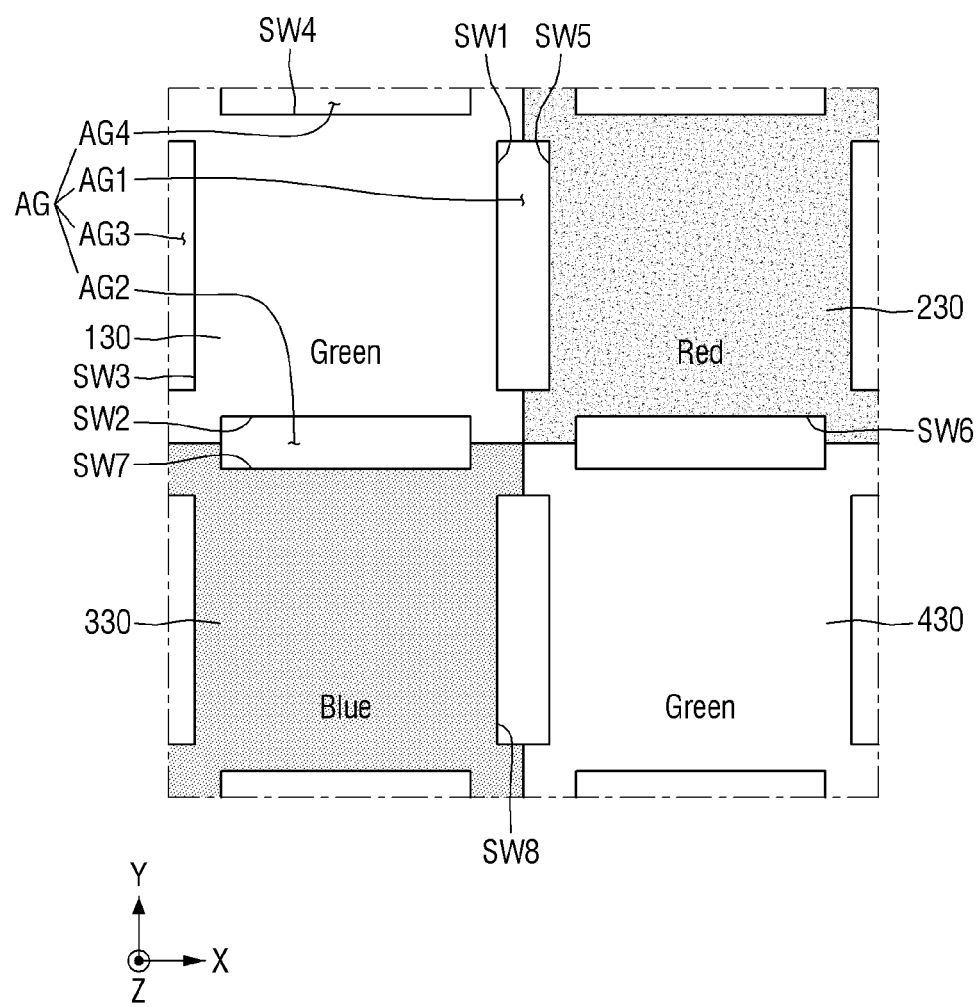
FIG. 11 is a layout view of an image sensor according to some example embodiments of the present disclosure.

FIG. 11 is a layout view of an image sensor according to some example embodiments of the present disclosure. For convenience, any redundant description of the example embodiments of FIGS. 1 through 5E will be omitted.

Referring to FIG. 11, at least two of first, second, third, and fourth air gaps AG1, AG2, AG3, and AG4 may be spaced apart from each other.

For example, part of a covering film 140 on a first sidewall SW1 and part of the covering film 140 on a second sidewall SW2 may not be placed in contact with each other. Since air gaps AG are formed in the covering film 140, the first air gap AG1, which is disposed on the first sidewall SW1, and the second air gap AG2, which is disposed on the second sidewall SW2, may be spaced apart from each other.

As illustrated in FIG. 11, the first, second, third, and fourth air gaps AG1, AG2, AG3, and AG4 may be spaced apart from one another. However, in some example embodiments, at least two of the first, second, third, and fourth air gaps AG1, AG2, AG3, and AG4 may be connected to each other.

A method of fabricating an image sensor according to some example embodiments of the present disclosure will hereinafter be described with reference to FIGS. 4 and 12 through 19.

FIGS. 12 through 19 are cross-sectional views illustrating a method of fabricating an image sensor according to some example embodiments of the present disclosure. For convenience, any redundant description of the example embodiments of FIGS. 1 through 5E will be omitted.

Figure 12:
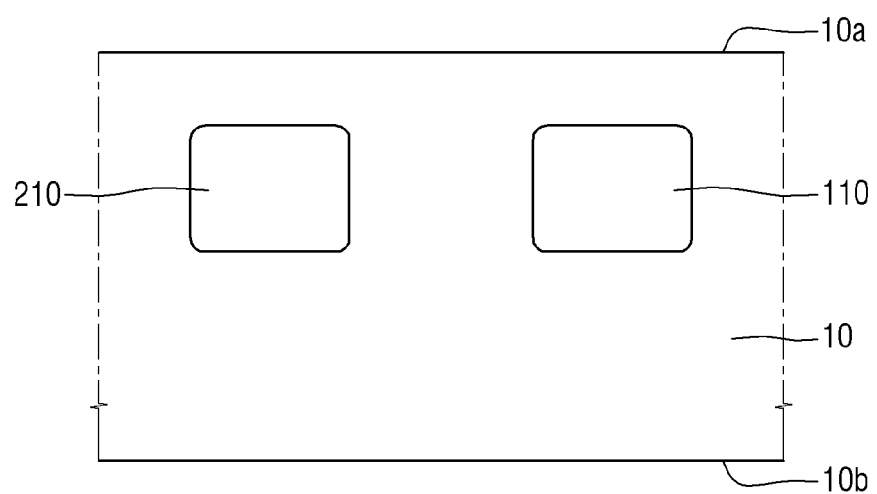
FIGS. 12 through 19 are cross-sectional views illustrating a method of fabricating an image sensor according to some example embodiments of the present disclosure.

Referring to FIG. 12, a substrate 10 is provided.

The substrate 10 may include first and second surfaces 10a and 10b, which face each other. Also, the substrate 10 may include first and second photoelectric elements 110 and 210. The first and second photoelectric elements 110 and 210 may correspond to the photoelectric transistor 11 of FIG. 2. For example, a PD, a photo-transistor, a photo-gate, a PPD, or a combination thereof may be used as the first or second photoelectric element 110 or 210.

Figure 13:
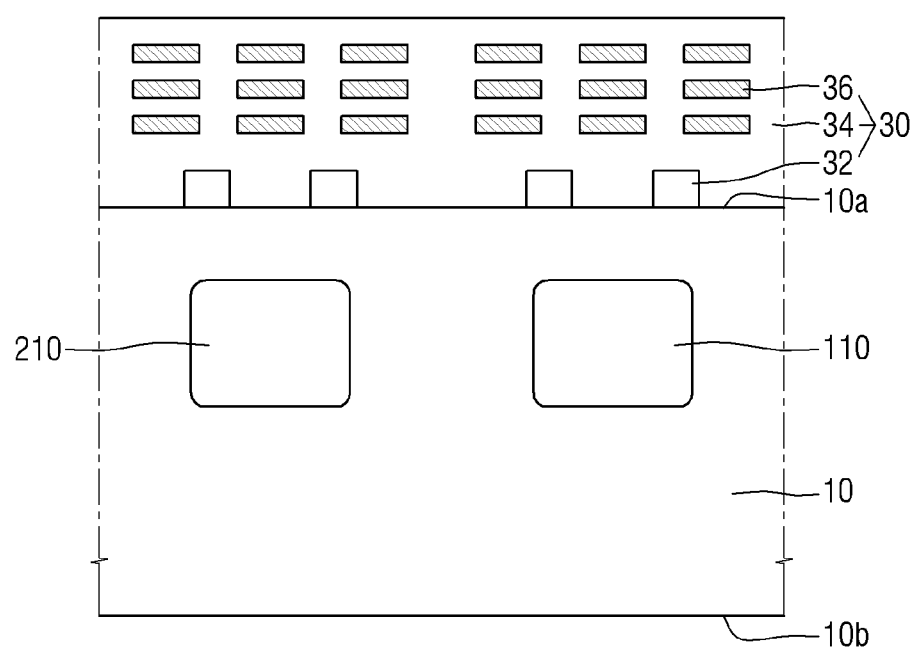

Referring to FIG. 13, an insulating structure 30 is formed on the first surface 10a of the substrate 10.

The insulating structure 30 may include gate structures 32, an insulating layer 34, and/or wiring structures 36.

The gate structures 32 may be formed on the first surface 10a of the substrate 10. The gate structures 32 may correspond to, for example, the gates of the charge transfer transistor 15, the drive transistor 17, the reset transistor 18, and the select transistor 19 of FIG. 2.

The insulating layer 34 may cover and surround the gate structures 32 and the wiring structures 36. That is, the insulating layer 34 may electrically insulate the gate structures 32 from one another and may electrically insulate the wiring structures 36 from one another.

The wiring structures 36 may include stacks of multiple wirings.

Figure 14:
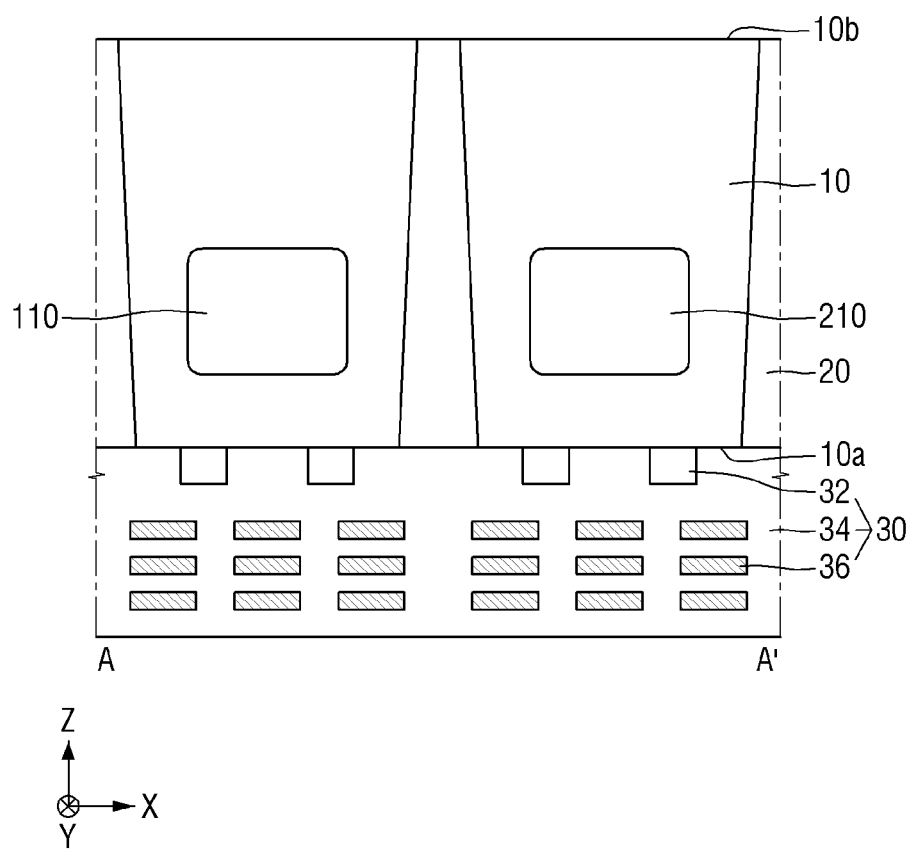

Referring to FIG. 14, an isolation film 20 is formed in the substrate 10.

Accordingly, a sensing area of an image sensor may be defined in the substrate 10. FIG. 14 illustrates an example in which the isolation film 20 has a tapered shape, but the present disclosure is not limited to this example.

Thereafter, the substrate 10 is turned upside down. As a result, the first surface 10a of the substrate 10 becomes the bottom surface of the substrate 10, and the second surface 10b of the substrate 10 becomes the top surface of the substrate 10. Also, the insulating structure 30 may be disposed below the substrate 10.

Figure 15:
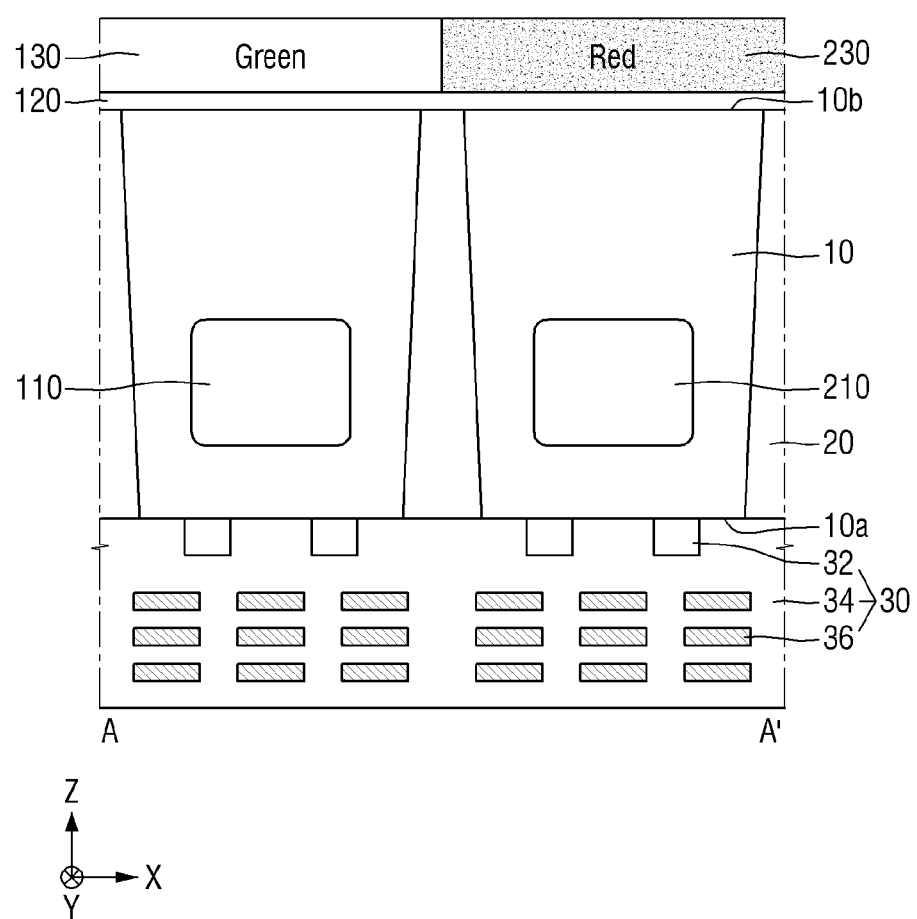

Referring to FIG. 15, a lower planarization film 120 is formed on the second surface 10b of the substrate 10. The lower planarization film 120 may comprise at least one of, for example, a silicon oxide film-based material, a silicon nitride film-based material, a resin, and a combination thereof.

Thereafter, first and second color filters 130 and 230 are formed on the lower planarization film 120. For example, the first color filter 130 may be formed to overlap with the first photoelectric element 110, and the second color filter 230 may be formed to overlap with the second photoelectric element 210.

FIG. 15 illustrates an example in which the first and second color filters 130 and 230 are placed in contact with each other, but the present disclosure is not limited thereto. That is, in another example, the first and second color filters 130 and 230 may be formed to be completely or partially spaced apart from each other.

In some example embodiments, before the formation of the first and second color filters 130 and 230, a grid pattern 180, which partially covers the lower planarization film 120, may be formed.

Figure 16:
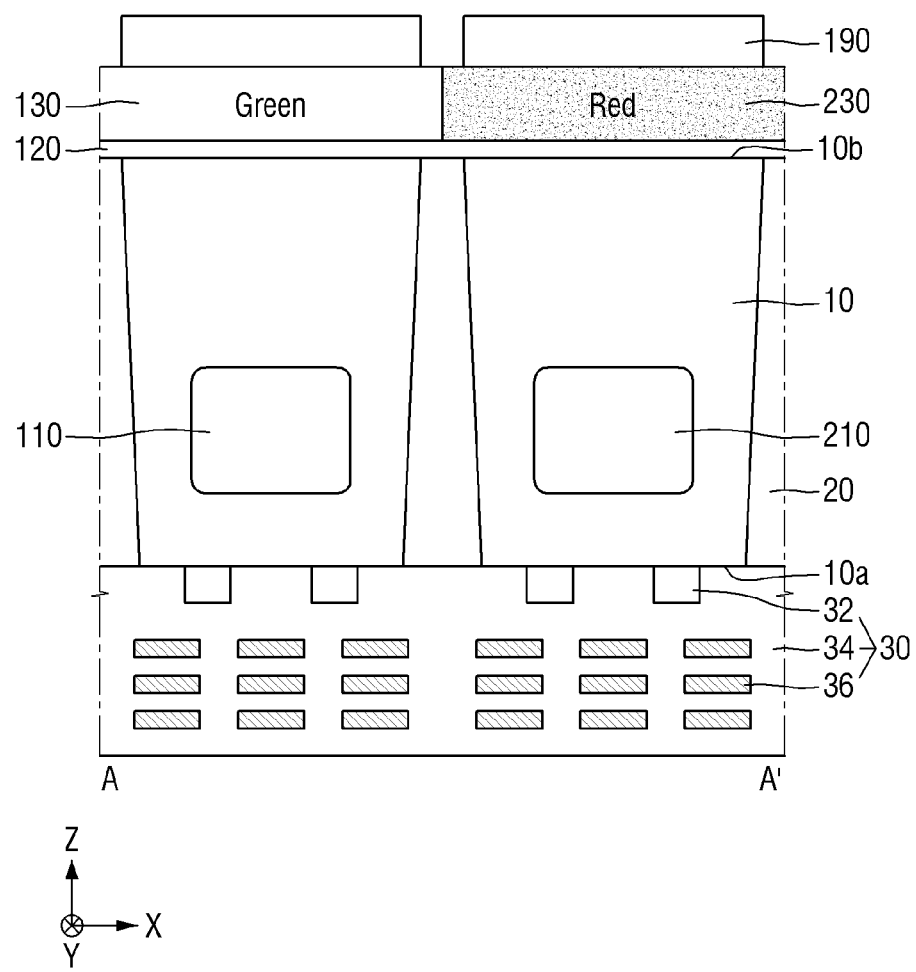

Referring to FIG. 16, a mask pattern 190 is formed on the first and second color filters 130 and 230. The mask pattern 190 may expose the interface between the first and second color filters 130 and 230.

The mask pattern 190 may comprise, for example, photoresist, but the present disclosure is not limited thereto.

Figure 17:
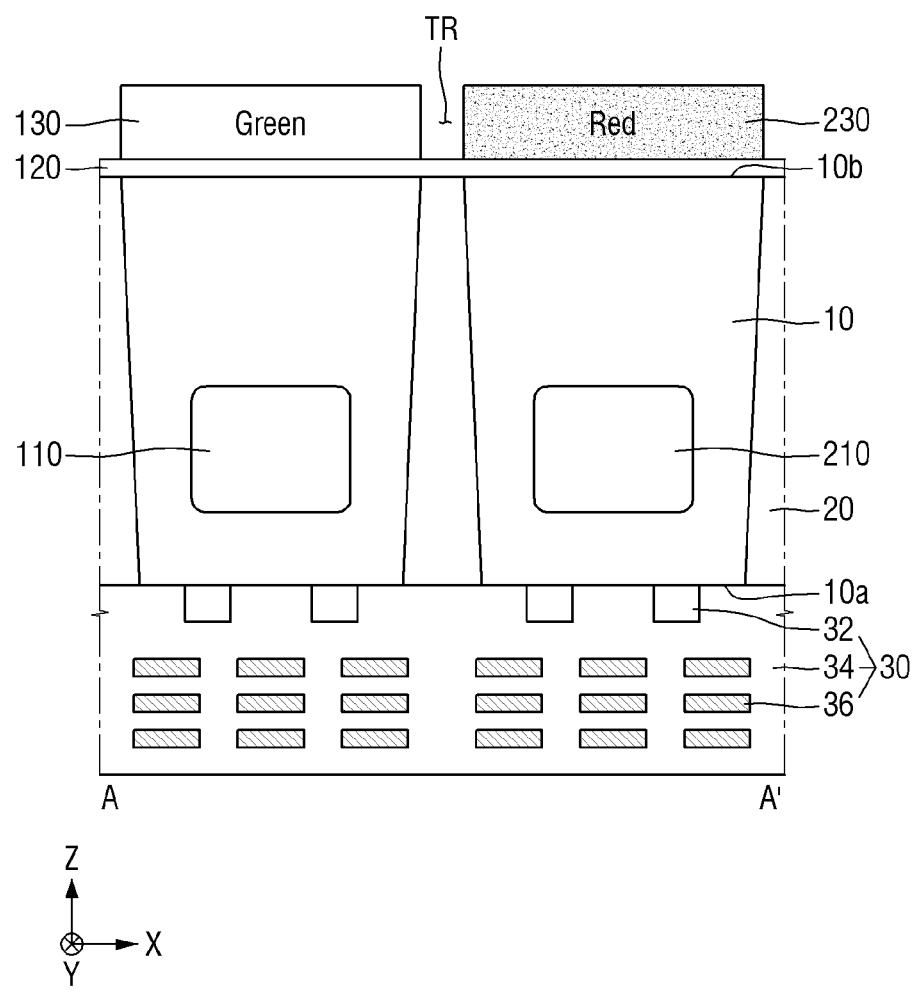

Referring to FIG. 17, an etching process is performed using the mask pattern 190 as an etching mask. As a result, a trench TR may be formed between the first and second color filters 130 and 230.

For example, the trench TR may be formed between the first and second color filters 130 and 230 through photolithography.

FIG. 17 illustrates an example in which the lower planarization film 120 is exposed by an etching process, but the present disclosure is not limited thereto. For example, in some example embodiments, the lower planarization film 120 may not be exposed by an etching process using the mask pattern 190 as an etching mask. That is, after an etching process, lower portions of the first and second color filters 130 and 230 may be placed in contact with each other.

Figure 18:
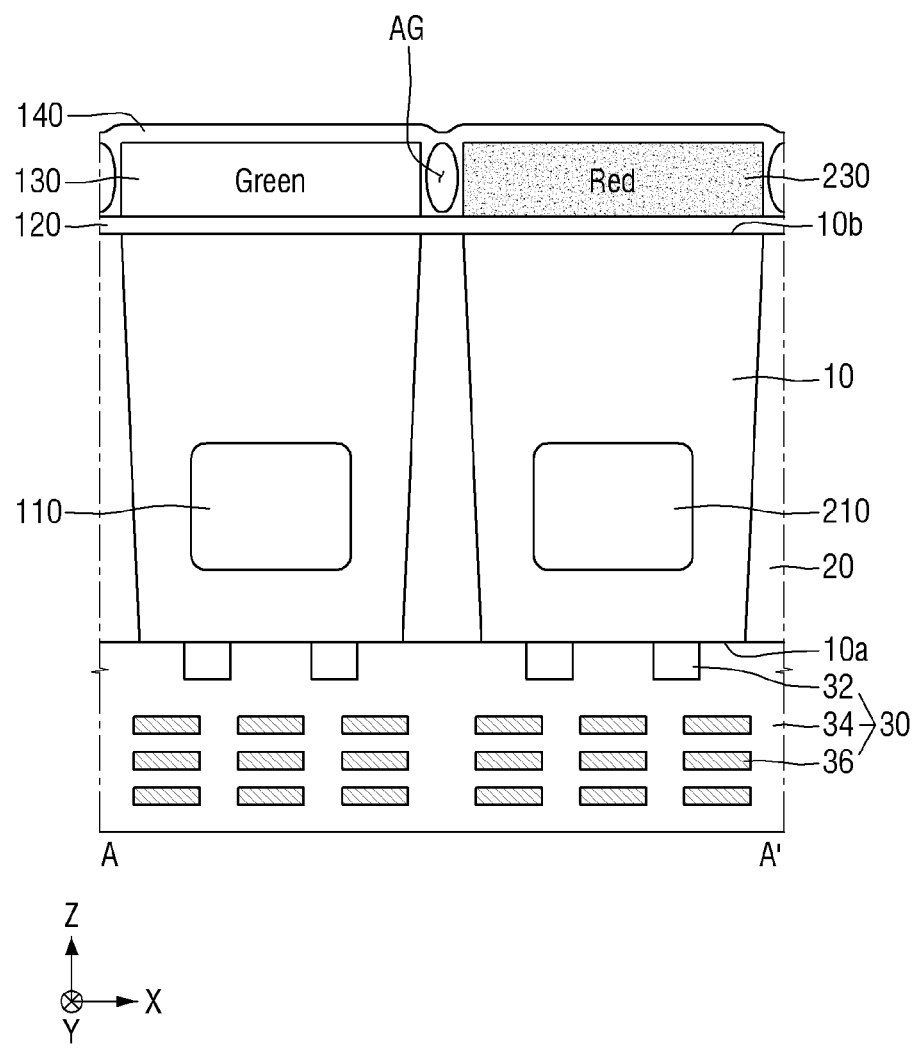

Referring to FIG. 18, a covering film 140 is formed in the trench TR.

The covering film 140 may comprise a material with poor step coverage. Thus, an air gap AG may be formed in the covering film 140 between opposing sidewalls of the first and second color filters 130 and 230.

In a case where the space formed between the first and second color filters 130 and 230 is sufficiently narrow, upper portions of the covering film 140 may all be connected during the formation of the covering film 140, and as a result, the air gap AG may be formed. For example, in a case where the distance between the first and second color filters 130 and 230 is 200 nm or less, the air gap AG may be formed in the covering film 140 during the formation of the covering film 140.

In a case where the covering film 140 has poor step coverage, the air gap AG can be easily formed. For example, in a case where the distance between the first and second color filters 130 and 230 is 200 nm or less, the air gap AG may be formed by depositing PTEOS to a thickness of 200 nm to 400 nm.

Figure 19:
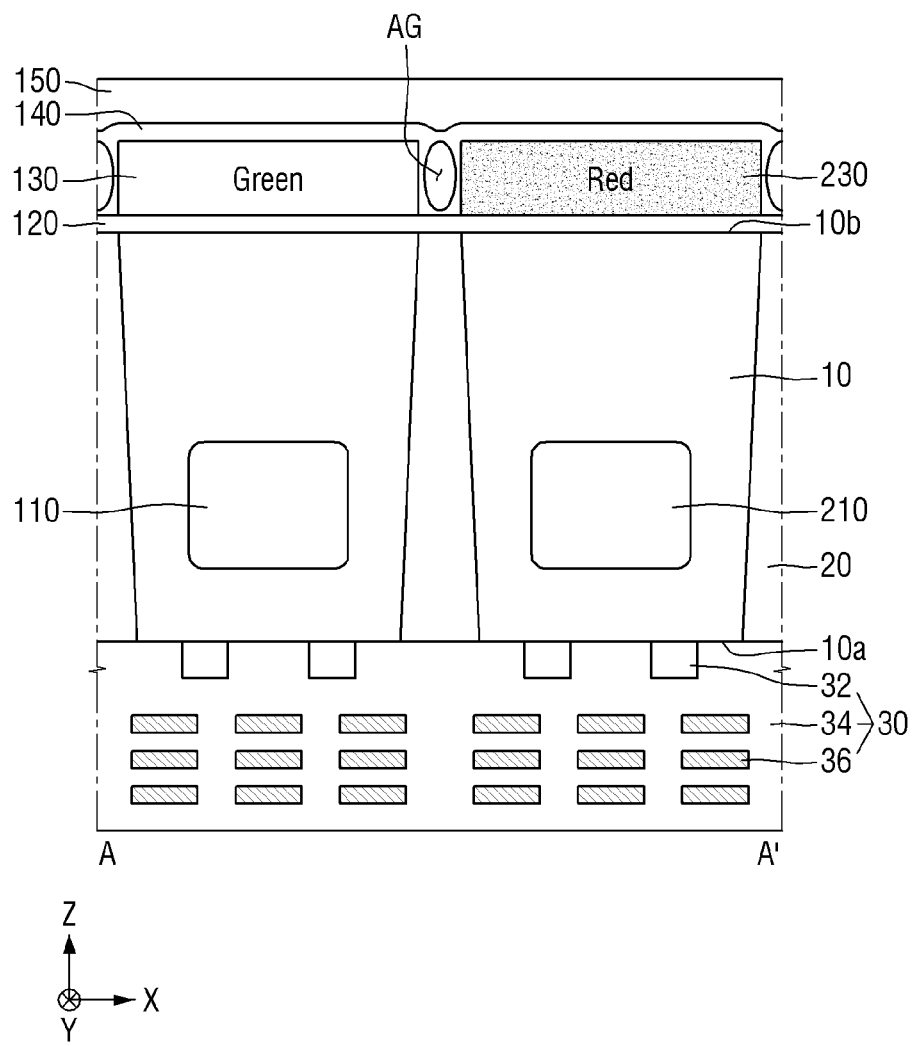

Referring to FIG. 19, an upper planarization film 150 is formed on the covering film 140. The upper planarization film 150 may comprise at least one of, for example, a silicon oxide film-based material, a silicon nitride film-based material, a resin, and a combination thereof.

Thereafter, referring to FIG. 4, microlenses 160 and a protective film 170 are formed on the upper planarization film 150.

The microlenses 160 may comprise, for example, an organic material such as a light-transmitting resin. For example, the microlenses 160 may be formed by forming an organic material pattern on the upper planarization film 150 and performing a thermal treatment operation. As a result of the thermal treatment operation, the organic material pattern may form the microlenses 160, which have a predetermined (or alternatively, desired) radius of curvature and have a convex shape.

The protective film 170 may be formed along the surfaces of the microlenses 160. The protective film 170 may comprise, for example, an inorganic material oxide film.

A method of fabricating an image sensor according to some example embodiments of the present disclosure will hereinafter be described with reference to FIGS. 4, 12 through 14, and 17 through 21.

Figure 20:
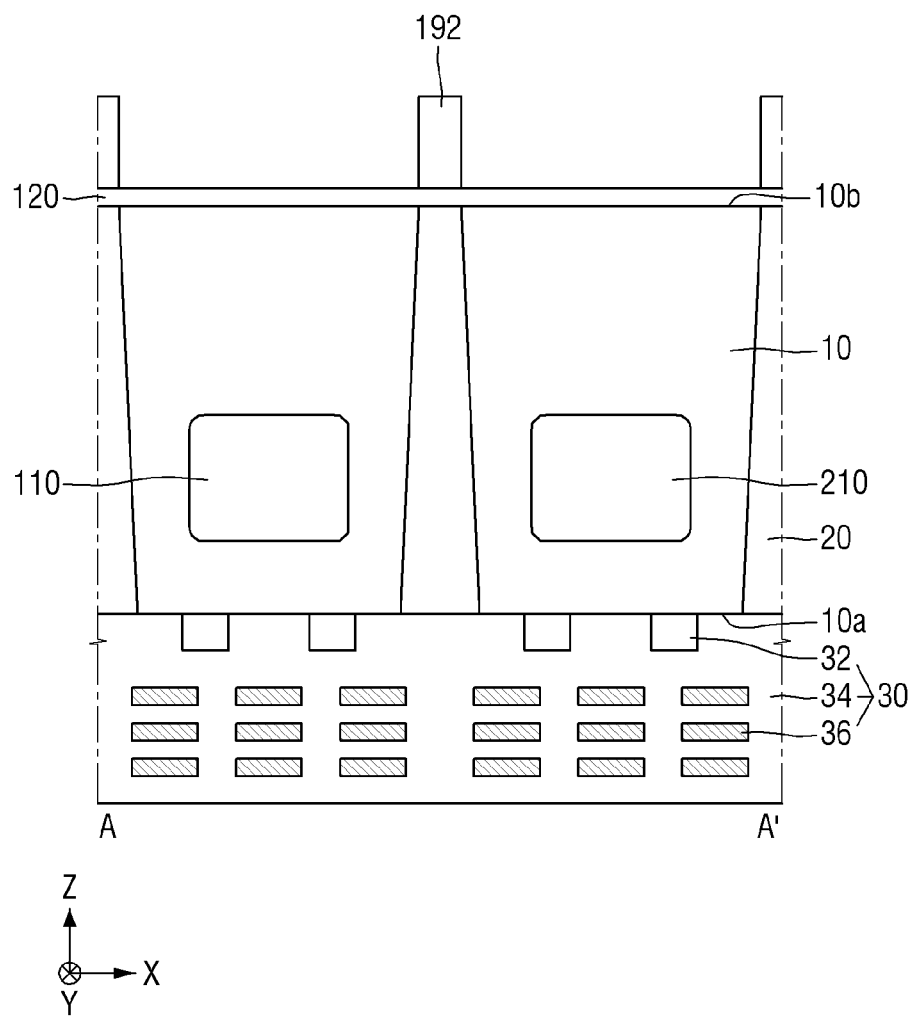
FIGS. 20 and 21 are cross-sectional views illustrating a method of fabricating an image sensor according to some example embodiments of the present disclosure.
Figure 21:
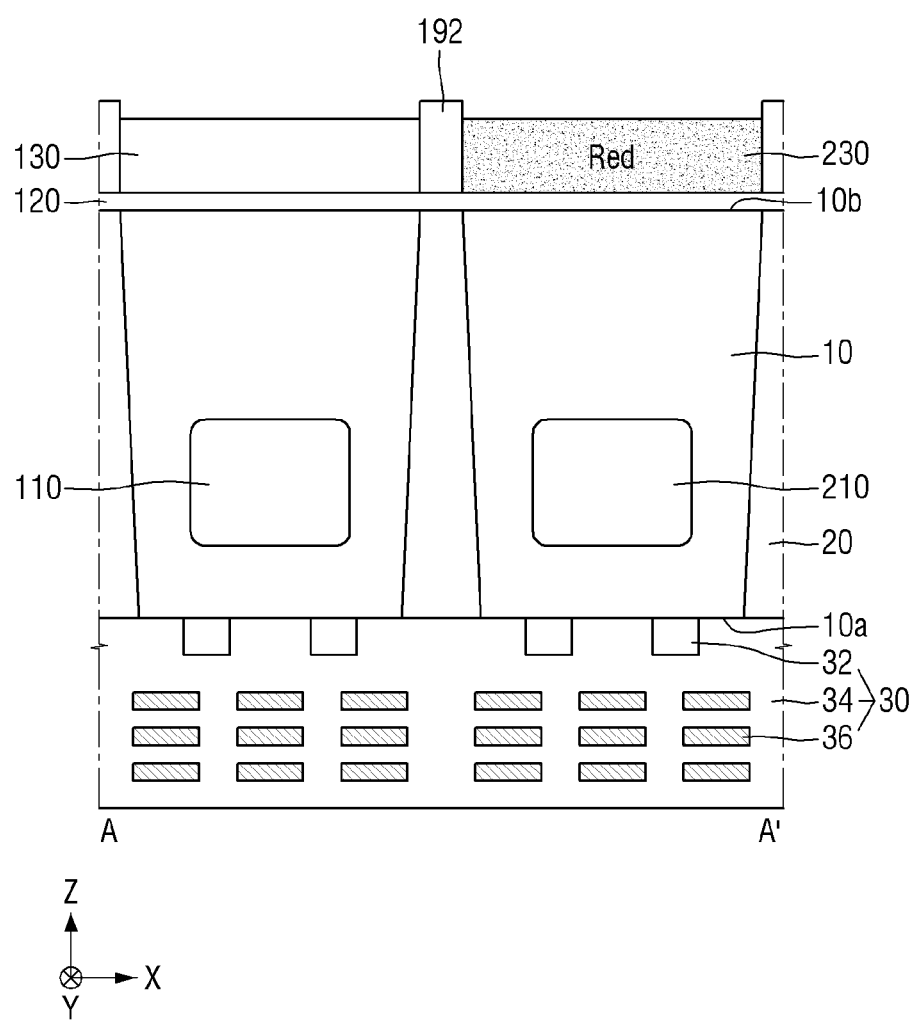

FIGS. 20 and 21 are cross-sectional views illustrating a method of fabricating an image sensor according to some example embodiments of the present disclosure. For convenience, any redundant description of the example embodiments of FIGS. 1 through 5E and 12 through 19 will be omitted.

Referring to FIG. 20, a lower planarization film 120 is formed on the structure illustrated in FIG. 14. That is, the lower planarization film 120 is formed on a second surface 10b of a substrate 10.

Thereafter, a fence 192 is formed on the lower planarization film 120. For example, the fence 192 may be formed on the lower planarization film 120 to overlap with the isolation film 20.

The fence 192 may comprise, for example, photoresist, but the present disclosure is not limited thereto.

Referring to FIG. 21, first and second color filters 130 and 230 are formed on the lower planarization film 120 and the fence 192.

For example, the first color filter 130 may be formed on one sidewall of the fence 192 and on the lower planarization film 120, and the second color filter 230 may be formed on the other sidewall of the fence 192 and on the lower planarization film 120. Accordingly, the first color filter 130 may be formed to overlap with a first photoelectric element 110, and the second color filter 230 may be formed to overlap with a second photoelectric element 210.

FIG. 21 illustrates an example in which the height of the top surface of the fence 192 is greater than the height of the top surfaces of the first and second color filters 130 and 230, but the present disclosure is not limited thereto. For example, the height of the top surfaces of the first and second color filters 130 and 230 may be substantially the same as the height of the top surface of the fence 192.

Thereafter, referring to FIG. 17, the fence 192 may be removed. As a result, a trench TR may be formed between the first and second color filters 130 and 230.

While the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present example embodiments be considered in all respects as illustrative and not restrictive, reference being made to the appended claims rather than the foregoing description to indicate the scope of the invention.

What is claimed is:

1. An image sensor comprising:
   a substrate including photoelectric elements;
   a first color filter on the substrate;
   a second color filter on the substrate adjacent to the first color filter; and
   a covering film between sidewalls of the first and second color filters, the covering film including an air gap enclosed within the covering film,
   wherein the covering film includes phenyltriethoxysilane (PTEOS).

2. The image sensor of claim 1, wherein
   the air gap includes a first sub-air gap, and a second sub-air gap on the first sub-air gap,
   a width of the first sub-air gap gradually increases away from the substrate, and
   a width of the second sub-air gap gradually decreases away from the substrate.

3. The image sensor of claim 2, wherein a first height from a lowermost part of the first sub-air gap to an uppermost part of the first sub-air gap is less than a second height from a lowermost part of the second sub-air gap to an uppermost part of the second sub-air gap.

4. The image sensor of claim 2, wherein a first height from a lowermost part of the first sub-air gap to an uppermost part of the first sub-air gap is greater than a second height from a lowermost part of the second sub-air gap to an uppermost part of the second sub-air gap.

5. The image sensor of claim 1, wherein a first height from a bottom surface of the covering film to a lowermost part of the air gap is greater than a second height from an uppermost part of the air gap to a top surface of the covering film.

6. The image sensor of claim 1, wherein a first height from a bottom surface of the covering film to a lowermost part of the air gap is less than a second height from an uppermost part of the air gap to a top surface of the covering film.

7. The image sensor of claim 1, wherein a refractive index of the covering film is lower than a refractive index of the first color filter and a refractive index of the second color filter.

8. The image sensor of claim 1, wherein a distance between the first and second color filters is 200 nm or less.

9. An image sensor comprising:
a substrate including photoelectric elements;
a color filter on the substrate and having a first sidewall, a second sidewall, which crosses the first sidewall, a third sidewall, opposite to the first sidewall, and a fourth sidewall, opposite to the second sidewall; and
a covering film on the first, second, third, and fourth sidewalls, the covering film having first, second, third, and fourth air gaps enclosed within the covering film along the first, second, third, and fourth sidewalls, respectively,
wherein the covering film includes phenyltriethoxysilane (PTEOS).

10. The image sensor of claim 9, wherein the covering film further extends along a top surface of the color filter.

11. The image sensor of claim 9, wherein the first, second, third, and fourth air gaps are continuous to surround the color filter.

12. The image sensor of claim 9, wherein the color filter includes a central portion, which includes the first and second sidewalls, and protruding portions, which protrude parts of the first and second sidewalls and are at corners of the central portion.

13. The image sensor of claim 9, wherein at least two of the first, second, third, and fourth air gaps are spaced apart from each other.

14. An image sensor comprising:
a substrate including photoelectric elements;
a first color filter on the substrate and including a first sidewall;
a second color filter on the substrate and including a second sidewall, opposite to the first sidewall; and
a covering film between the first and second sidewalls, the covering film having a void enclosed within the covering film,
wherein the covering film includes phenyltriethoxysilane (PTEOS).

15. The image sensor of claim 14, wherein
the covering film includes a first portion, which extends along the first sidewall, and a second portion, which extends along the second sidewall, and
the first and second portions define the void.

16. The image sensor of claim 15, wherein
the covering film further includes a third portion, which extends along a top surface of the first color filter, and a fourth portion, which extends along a top surface of the second color filter, and
a thickness of the first portion is smaller than a thickness of the third portion.

17. The image sensor of claim 14, wherein
the first color filter includes a third sidewall, which crosses the first sidewall, and a first protruding portion, which protrudes from a corner defined by the first and third sidewalls,
the second color filter includes a fourth sidewall, which crosses the second sidewall, and a second protruding portion, which protrudes from a corner defined by the second and fourth sidewalls, and
a distance between the first and second protruding portions is smaller than a distance between the first and second sidewalls.

18. The image sensor of claim 17, further comprising:
a third color filter including a fifth sidewall, which is opposite to the third sidewall, and a sixth sidewall, which crosses the fifth sidewall,
wherein the third color filter further includes a third protruding portion, which protrudes from a corner defined by the fifth and sixth sidewalls, and
a distance between the second and third protruding portions is smaller than a distance between the first and second sidewalls.

19. The image sensor of claim 17, wherein top surfaces of the first and second protruding portions are L-shaped.

* * * * *